US012699877B2

(12) United States Patent
Kim et al.

(10) Patent No.: US 12,699,877 B2
(45) Date of Patent: Aug. 4, 2026

(54) NETWORK-CENTRIC ARCHITECTURE AND ALGORITHMS TO ACCELERATE DISTRIBUTED TRAINING OF NEURAL NETWORKS

(71) Applicant: Board of Trustees of the University of Illinois, Urbana, IL (US)

(72) Inventors: Nam Sung Kim, Champaign, IL (US); Youjie Li, Changsha (CN); Alexander Gerhard Schwing, Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 1267 days.

(21) Appl. No.: 17/284,418

(22) PCT Filed: Oct. 11, 2019

(86) PCT No.: PCT/US2019/055948
§ 371 (c)(1),
(2) Date: Apr. 9, 2021

(87) PCT Pub. No.: WO2020/081399
PCT Pub. Date: Apr. 23, 2020

(65) Prior Publication Data
US 2021/0374503 A1       Dec. 2, 2021

Related U.S. Application Data

(60) Provisional application No. 62/745,709, filed on Oct. 15, 2018.

(51) Int. Cl.
*G06N 3/045* (2023.01)
*G06N 3/10* (2006.01)
*H03M 7/30* (2006.01)

(52) U.S. Cl.
CPC ............... *G06N 3/045* (2023.01); *G06N 3/10* (2013.01); *H03M 7/702* (2013.01)

(58) Field of Classification Search
CPC ........ G06N 3/045; G06N 3/0455; G06N 3/10; H03M 7/702
See application file for complete search history.

(56) References Cited

U.S. PATENT DOCUMENTS

| | | |
|---|---|---|
| 5,321,819 A | 6/1994 | Szczepanek |
| 5,745,125 A | 4/1998 | Deering et al. |

(Continued)

OTHER PUBLICATIONS

Ueno, Y., "Technologies behind Distributed Deep Learning: AllReduce," Preferred Networks Research Blog, Jul. 10, 2018, 8 pages.

(Continued)

*Primary Examiner* — Rachel J Hackenberg
(74) *Attorney, Agent, or Firm* — Lowenstein Sandler LLP

(57) ABSTRACT

A distributed network includes a first group of computing devices. Each computing device is to be coupled to two neighbor computing devices of the first group of computing device and is to: (i) aggregate gradient values received from a first neighbor computing device with local gradient values to generate a partial aggregate of gradient values that are to train a neural network model; (ii) transfer the partial aggregate of gradient values to a second neighbor computing device; and repeat (i) and (ii) until a first aggregate of gradient values from the first group of computing devices is buffered at a first computing device of the first group of computing devices. The first computing device is to transfer the first aggregate of gradient values to a second group of computing devices of the distributed network for further aggregation.

16 Claims, 16 Drawing Sheets

(56) References Cited

U.S. PATENT DOCUMENTS

| | | | |
|---|---|---|---|
| 6,650,327 B1 | 11/2003 | Airey et al. | |
| 11,049,006 B2* | 6/2021 | Langford | G06N 3/045 |
| 11,244,243 B2* | 2/2022 | Chapman | G06N 20/00 |
| 2013/0290223 A1 | 10/2013 | Chapelle et al. | |
| 2015/0286465 A1 | 10/2015 | Dickie | |
| 2016/0292303 A1* | 10/2016 | Hong | G06F 16/254 |
| 2017/0185549 A1 | 6/2017 | Pope | |
| 2017/0308789 A1 | 10/2017 | Langford et al. | |
| 2018/0268283 A1* | 9/2018 | Gilad-Bachrach | G06F 17/18 |
| 2019/0294967 A1* | 9/2019 | Kumar | G06N 3/0499 |
| 2019/0312772 A1* | 10/2019 | Zhao | G06F 9/5011 |
| 2021/0034978 A1* | 2/2021 | Kato | G06N 3/098 |

OTHER PUBLICATIONS

Lin et al., "Deep Gradient Compression: Reducing the Communication Bandwidth for Distributed Training," ICLR, 2018, 14 pages.
Park et al., "Scale-Out Acceleration for Machine Learning," Proceedings of the 50th Annual IEEE/ACM International Symposium on Microarchitecture, Oct. 2017, 15 pages.
Wen et al., "TernGrad: Ternary Gradients to Reduce Communication in Distributed Deep Learning," 31st Conference on Neural Information Processing Systems, 2017, 11 pages.
Seide et al., "1-Bit Stochastic Gradient Descent and its Application to Data-Parallel Distributed Training of Speech DNNs," Interspeech , 2014, 5 pages.
PCT Notification of Transmittal Of The International Search Report And The Written Opinion Of The International Searching Authority for PCT Application No. PCT/US2019/055838, mailed Feb. 11, 2020, 20 pages.
Watcharapichat et al. "Ako: Decentralised deep learning with partial gradient exchange," Proceedings of the Seventh ACM Symposium on Cloud Computing, Oct. 7, 2016, retrieved on Jan. 24, 2020 from https://lsds.doc.ic.ac.uk/sites/default/files/ako-socc16.pdf, 14 pages.
Ben-Nun et al., "Demystifying parallel and distributed deep learning: An In-depth concurrency analysis," ACM Computing Surveys (CSUR), Sep. 15, 2018, Retrieved Jan. 24, 2020 from https://arxiv.org/pdf/1802.09941.pdf, 47 pages.
Wang et al., "Energy efficient parallel neuromorphic architectures with approximate arithmetic on FPGA," Eurocomputing, vol. 221, 2017, pp. 146-158.
Venkataramani et al., "Scaledeep: A scalable compute architecture for learning and evaluating deep networks," in ISCA, 2017, 14 pages.
Zhang et al., "Machine learning on FPGAs to face the IoT revolution," in Proceedings of the 36th International Conference on Computer-Aided Design, ICCAD '17, IEEE Press, Nov. 2017, pp. 894-901.
Zhang et al., "High-performance video content recognition with long-term recurrent convolutional network for FPGA," in Field Programmable Logic and applications (FPL), 2017 27th International Conference on, 2017, 4 pages.
Rhu et al, "vDNN: Virtualized deep neural networks for scalable, memory-efficient neural network design" in Micro, 2016, 13 pages.
Recht et al., "Hogwild: A lock-free approach to parallelizing stochastic gradient descent," in NIPS, Jun. 2011, 22 pages.
Shafiee et al., "Isaac: A convolutional neural network accelerator with in-situ analog arithmetic in crossbars," in ISCA, Oct. 5, 2016, 13 pages.
Google, "Snappy compression: https://github.com/google/snappy," 2011, 5 pages.
Aymeric Damien, "TensorFlow-examples," https://github.com/aymericdamien/TensorFlow-Examples/blob/master/examples/3_NeuralNetworks/multilayer_perceptron.py, 2017.
Intel Corporation, "Intel math kernel library," https://software.intel.com/en-us/mkl, 2018, 6 pages.
Open MPI Community, "Open MPI: A high performance message passing library," https://www.open-mpi.org/, 2017, 2 pages.

Samsung Corporation, "Samsung DDR4 product guide," http://www.samsung.com/semiconductor/global/file/product/DDR4-Product-guide-May15.pdf, May 2018, 23 pages.
Netgear Corporation, "Prosafe xs712t switch," https://www.netgear.com/support/product/xs712t.aspx, 2017, 4 pages.
Andreyev, A., "Introducing data center fabric, the next-generation Facebook data center network," https://code.facebook.com/posts/360346274145943/introducting-data-center-fabric-the-next-generation-facebook-data-center-network/, 2014, 11 pages.
Intel Corp, "Intel x540," https://www.intel.com/content/www/us/en/ethernet-products/converged-network-adapter/ethernet-x540-12-briefl.html, 2017, 6 pages.
Dean et al., "Google Cloud TPUs," https://www.blog.google/topics/google-cloud/google-cloud-offer-tpus-machine-learning/, 2017, 6 pages.
Nvidia Corporation, "Nvidia Cuda C programming guide," Apr. 16, 2012, 173 pages.
Google Inc, "Tensorflow model zoo," https://github.com/tensorflow/models, 2017, 4 pages.
Dean et al., "Large Scale distributed deep networks," in NIPS, 2012, 11 pages.
Ho, et al., "More effective distributed ML via a stale synchronous parallel parameter server," in NIPS, Nov. 13, 2013, 16 pages.
Chilimbi et al., "Project Adam: Building an efficient and scalable deep learning training system," in OSDI, Oct. 6-8, 2014, pp. 571-582.
Li et al., "Scaling distributed machine learning with the parameter server," in OSDI, Oct. 6-8, 2014, pp. 583-598.
Moritz et al., "SparkNet: Training deep networks in spark," in ICLR, Feb. 28, 2016, 13 pages.
Iandola et al., "Firecaffe: near-linear acceleration of deep neural network training on compute clusters," in CVPR, Jan. 8, 2016, pp. 14.
Goyal et al., "Accurate, large minibatch SGD: training ImageNet in 1 hour," in arXiv:1706.02677 [cs.CV], Apr. 30, 2018, 12 pages.
Smith et al., "Don't decay the learning rate, increase the batch size," in ICLR, 2018, 11 pages.
You et al., "100-epoch ImageNet Training with AlexNet in 24 Minutes," in arXiv:1709.0501 1v10 [cs.CV], Oct. 16, 2017, 10 pages.
Lecun et al., "Deep learning," Nature, vol. 521, May 28, 2015, 9 pages.
Iandola, "Exploring the Design Space of Deep Convolutional Neural Networks at Large Scale," in arXiv:1612.06519, Dec. 16, 2016, 128 pages.
Banerjee et al., "Re-designing CNTK Deep Learning Framework on Modern GPU Enabled Clusters," in CloudCom, 2016, 8 pages.
Awan et al., "S-Caffe: Co-designing MPI Runtimes and Caffe for Scalable Deep Learning on Modern GPU Clusters," In PPoPP, 2017, pp. 193-205.
Simonyan et al., "Very deep convolutional networks for large-scale image recognition," CoRR, vol. abs/1409.1556, Apr. 10, 2015, 14 pages.
Krizhevsky et al., "Imagenet classification with deep convolutional neural networks," in Proc. NIPS, 2012, 9 pages.
He, et al. "Deep residual learning for image recognition," arXiv preprint arXiv:1512.03385, Dec. 10, 2015, 12 pages.
Russakovsky et al., "ImageNet Large Scale Visual Recognition Challenge," in IJCV, Dec. 1, 2014, 38 pages.
Kokkinos, "Ubernet: Training a universal convolutional neural network for low-, mid-, and high-level vision using diverse datasets and limited memory," in CVPR, 2017, pp. 5454-5463.
Reagen et al., "Minerva: Enabling low-power, highly-accurate deep neural network accelerators," in ISCA, 2016, 93 pages.
Jouppi, et al., "In-datacenter performance analysis of a tensor processing unit," in ISCA, Jun. 24-28, 2017, 12 pages.
Thakur et al., "Optimization of collective communication operations in mpich," IJHPCA, vol. 19, No. 1, Spring 2005, pp. 49-66.
Wen et al., "TernGrad: Ternary gradients to reduce communication in distributed deep learning," in NIPS, CoRR, vol. abs/1705.07878, Dec. 29, 2017, 13 pages.
Alistarh et al., "QSGD: Communication-Efficient SGD via Gradient Quantization and Encoding," in NIPS, Dec. 6, 2017, 29 pages.

(56)  References Cited

OTHER PUBLICATIONS

Dryden et al., "Communication quatization for data-parallel training of deep neural networks," In MLHPC@SC. IEEE Computer Society, 2016, 8 pages.

Strom, N., "Scalable distributed dnn training using commodity gpu cloud computing," in Interspeech, Sep. 6-10, 2015, 5 pages.

Sitaridi, et al., "Massively-parallel lossless data decompression," in Parallel Processing (ICPP), 2016 45th International Conference on IEEE, 2016, 6 pages.

Di et al., "Fast error-bounded lossy hpc data compression with sz," in 2016 IEEE International Parallel and Distributed Processing Symposium (IPDPS), May 2016, 10 pages.

Alian et al., "NCAP: Network-driven, packet context-aware power management for client-server architecture," in High Performance Computer Architecture (HPCA), 2017 IEEE International Symposium on IEEE, 2017, 12 pages.

Singh et al., "Jupiter rising: A Decade of Clos Topologies and Centralized Control in Google's Datacenter network," in Sigcomm '15, Aug. 17-21, 2015, pp. 183-197.

Shen et al., "Maximizing CNN accelerator efficiency through resource partitioning," in ISCA '17, Jun. 24-28, 2017, pp. 535-547.

Albericio et al., "Cnvlutin: Ineffectual-neuron-free deep neural network computing," in ISCA, 2016.

Judd et al., "Cnvlutin2: Ineffectual-Activation-and-Weight-Free Deep Neural Network Computing," in ISCA, Apr. 29, 2017, 6 pages.

Han et al., "EIE: efficient inference engine on compressed deep neural network," in ISCA, 2016, pp. 243-254.

Chen et al., "Eyeriss: A spatial architecture for energy-efficient dataflow for convolutional neural networks," in ISCA, 2016, pp. 367-379.

Chen et al., "Diannao: a small-footprint high-throughput accelerator for ubiquitous machine-learning," In ASPLOS '14, Mar. 1-5, 2014, pp. 269-283.

Du et al., "ShiDianNao: shifting vision processing closer to the sensor," in ISCA '15, Jun. 13-17, 2015, pp. 92-104.

Chen et al., "Diadiannao: A machine-learning supercomputer," In IEEE/ACM International Symposium on Microarchitecture, 2014, pp. 609-622.

Sharma et al., "From high-level deep neural models to FPGAs," in Micro, Oct. 2016, 12 pages.

Lu et al., "Flexflow: A flexible dataflow accelerator architecture for convolutional neural networks," in IEEE International Symposium on HPCA, 2017, 12 pages.

Xilinx Inc, "Xilinx Virtex-7 FPGA VC709 Connectivity Kit," user guide, https://www.xilinx.com/products/boards-and-kits/dk-v7-vc709-g.html,' Dec. 20, 2014, 100 pages.

Lecun et al., "Gradient-based learning applied to document recognition," IEEE, vol. 86, No. 11, Nov. 1998, 47 pages.

Abadi et al., "TensorFlow: Large-scale machine learning on heterogeneous distributed systems," arXiv:1603.04467 [cs], Mar. 16, 2016, 19 pages.

Alwani et al., "Fused-layer CNN Accelerators," in Micro, 2016, 12 pages.

Ding et al., "CirCNN: Accelerating and compressing deep neural networks using block-circulant weight matrices," in Micro, 2017, 14 pages.

Chung et al., "Accelerating persistent neural networks at datacenter scale," in HotChips, 2017, 52 pages.

Mahajan et al., "TABLA: A unified template based framework for accelerating statistical machine learning," in HPCA, 2016, 13 pages.

Li et al., "Scaling distributed machine learning with the parameter server," in OSDI, 2014, 16 pages.

Li et al., "Communication efficient distributed machine learning with the parameter server," in NIPS, 2014, 9 pages.

Ho et al., "More effective distributed ML via a stale synchronous parallel parameter server," in NIPS, 2013, 16 pages.

Wang et al., "Liquid state machine based pattern recognition on fpga with firing-activity dependent power gating and approximate computing," in ISCAS, 2016, 4 pages.

* cited by examiner

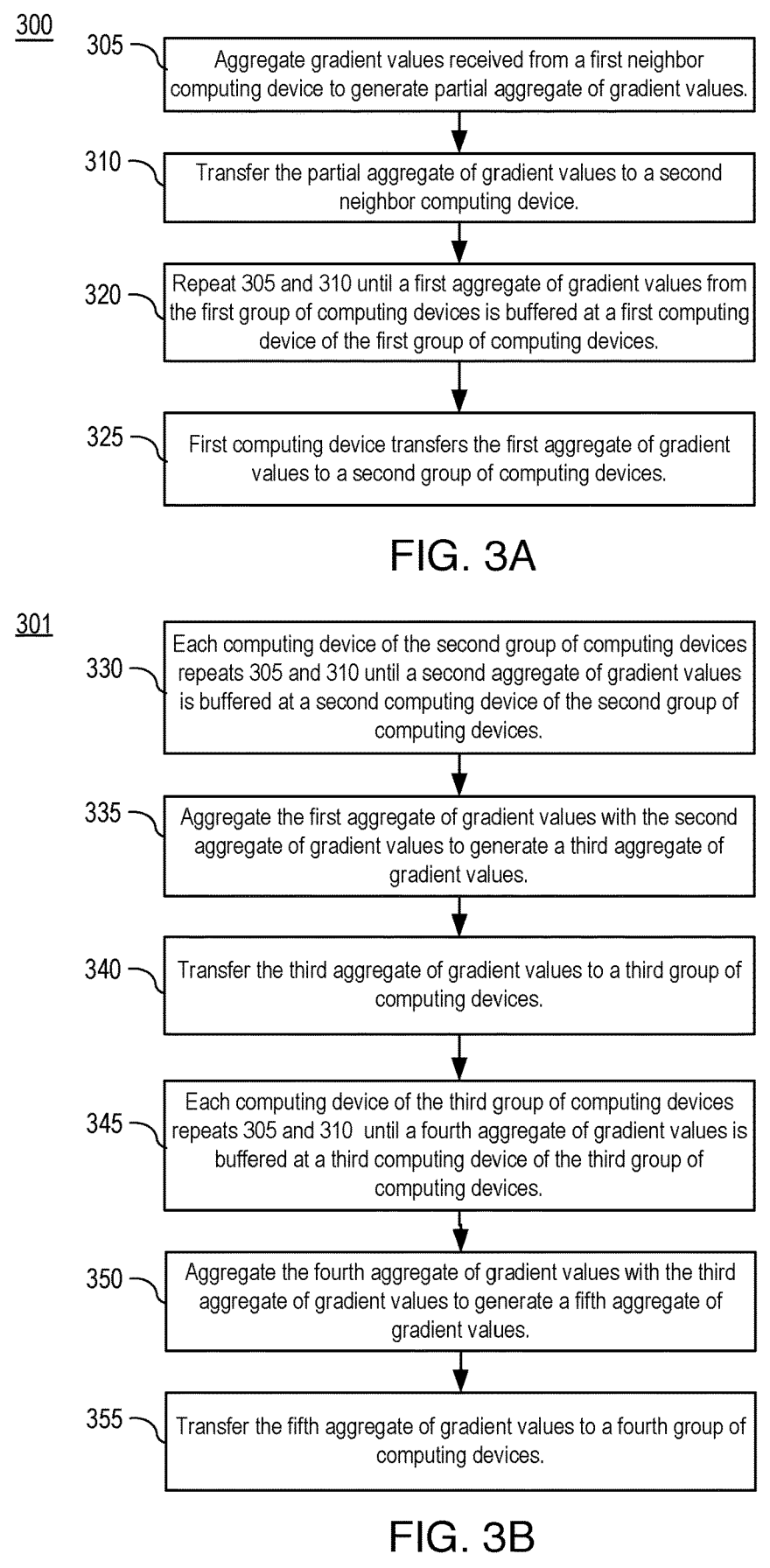

300

305 — Aggregate gradient values received from a first neighbor computing device to generate partial aggregate of gradient values.

310 — Transfer the partial aggregate of gradient values to a second neighbor computing device.

320 — Repeat 305 and 310 until a first aggregate of gradient values from the first group of computing devices is buffered at a first computing device of the first group of computing devices.

325 — First computing device transfers the first aggregate of gradient values to a second group of computing devices.

330 — Each computing device of the second group of computing devices repeats 305 and 310 until a second aggregate of gradient values is buffered at a second computing device of the second group of computing devices.

335 — Aggregate the first aggregate of gradient values with the second aggregate of gradient values to generate a third aggregate of gradient values.

340 — Transfer the third aggregate of gradient values to a third group of computing devices.

345 — Each computing device of the third group of computing devices repeats 305 and 310 until a fourth aggregate of gradient values is buffered at a third computing device of the third group of computing devices.

350 — Aggregate the fourth aggregate of gradient values with the third aggregate of gradient values to generate a fifth aggregate of gradient values.

355 — Transfer the fifth aggregate of gradient values to a fourth group of computing devices.

FIG. 3B

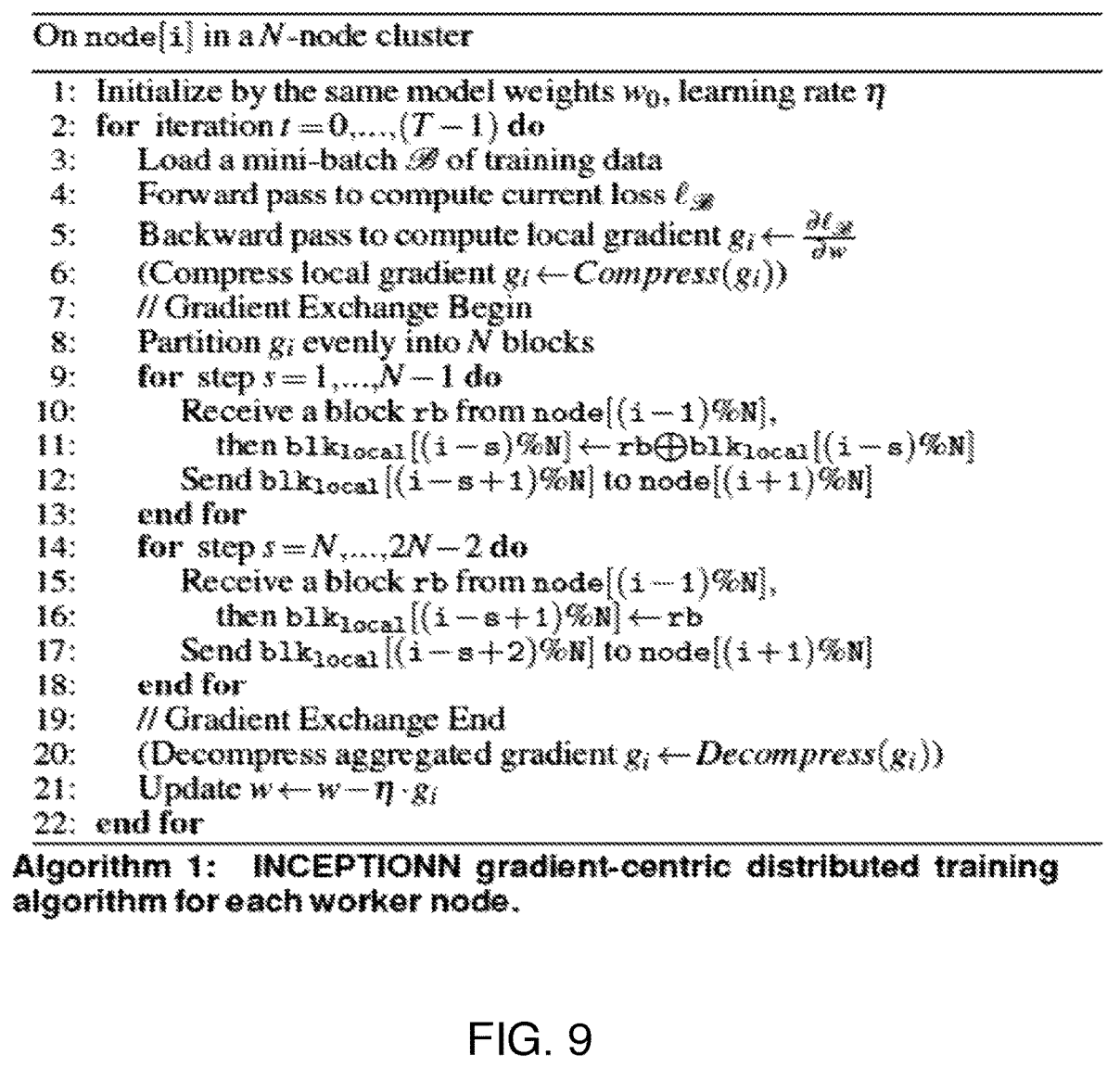

On node[i] in a $N$-node cluster

1: Initialize by the same model weights $w_0$, learning rate $\eta$
2: for iteration $t = 0,...,(T-1)$ do
3:     Load a mini-batch $\mathscr{B}$ of training data
4:     Forward pass to compute current loss $\ell_{\mathscr{B}}$
5:     Backward pass to compute local gradient $g_i \leftarrow \frac{\partial \ell_{\mathscr{B}}}{\partial w}$
6:     (Compress local gradient $g_i \leftarrow Compress(g_i)$)
7:     // Gradient Exchange Begin
8:     Partition $g_i$ evenly into $N$ blocks
9:     for step $s = 1,...,N-1$ do
10:       Receive a block rb from node[(i − 1)%N],
11:         then blk$_{\text{local}}$[(i − s)%N] ← rb$\oplus$blk$_{\text{local}}$[(i − s)%N]
12:       Send blk$_{\text{local}}$[(i − s + 1)%N] to node[(i + 1)%N]
13:     end for
14:     for step $s = N,...,2N-2$ do
15:       Receive a block rb from node[(i − 1)%N],
16:         then blk$_{\text{local}}$[(i − s + 1)%N] ← rb
17:       Send blk$_{\text{local}}$[(i − s + 2)%N] to node[(i + 1)%N]
18:     end for
19:     // Gradient Exchange End
20:     (Decompress aggregated gradient $g_i \leftarrow Decompress(g_i)$)
21:     Update $w \leftarrow w - \eta \cdot g_i$
22: end for

Algorithm 1: INCEPTIONN gradient-centric distributed training algorithm for each worker node.

FIG. 9

```
Input      : v: Compressed bit vector (32, 16, 8, or 0 bits)
             t: 2-bit tag indicating the compression mechanism
Output     : f: 32-bit single-precision FP value if (t = NO_COMPRESS) then
  | f ← v[31:0]
else if (t = 0BIT_COMPRESS) then
  | f ← 32'b0
else
  | if (t = 8BIT_COMPRESS) then
  |   | s ← v[7]
  |   | n_shift ← first_1_loc_from_MSB (v[6:0])
  |   | m ← concat (v[6:0] << n_shift, 16'b0)
  | else if (t = 16BIT_COMPRESS) then
  |   | s ← v[15]
  |   | n_shift ← first_1_loc_from_MSB (v[14:0])
  |   | m ← concat (v[14:0] << n_shift, 8'b0)
  | end
  | e ← 127 − n_shift
  | f ← concat (s, e, m)
end
```

Algorithm 3: Decompression algorithm.

FIG. 10

```
Input      : f: 32-bit single-precision FP value
Output     : v: Compressed bit vector (32, 16, 8, or 0 bits)
             t: 2-bit tag indicating the compression mechanism s ← f[31]        // sign
e ← f[30:23]     // exponent
m ← f[22:0]      // mantissa
if (e ≥ 127) then
  | v ← f[31:0]
  | t ← NO_COMPRESS  // 2'b11
else if (e < error_bound) then
  | v ← {}
  | t ← 0BIT_COMPRESS  // 2'b00
else if (error_bound ≤ e < 127) then
  | n_shift ← 127 − e
  | shifted_m ← concat(1'b1, m) >> n_shift
  | if (e ≥ error_bound + ⌈(127 − error_bound)/2⌉) then
  |   | v ← concat(s, shifted_m[22:8])
  |   | t ← 16BIT_COMPRESS  // 2'b10
  | else
  |   | v ← concat(s, shifted_m[22:16])
  |   | t ← 8BIT_COMPRESS  // 2'b01
  | end
end
```

Algorithm 2: Lossy compression algorithm for single-precision floating-point gradients.

NETWORK-CENTRIC ARCHITECTURE AND ALGORITHMS TO ACCELERATE DISTRIBUTED TRAINING OF NEURAL NETWORKS

REFERENCE TO EARLIER FILED APPLICATION

This application claims the benefit under 35 U.S.C. § 119(e) of U.S. Provisional Patent Application No. 62/745,709, entitled "Network-Centric Hardware/Algorithm Co-design to Accelerate Distributed Training of Deep Neural Networks," filed Oct. 15, 2018, which is incorporated herein, in its entirety, by this reference.

FEDERALLY SPONSORED RESEARCH OR DEVELOPMENT

This disclosure was made with government support under CNS-1705047 and CNS-1557244 awarded by the National Science Foundation. The government has certain rights in the invention.

BACKGROUND

Distributed training has been a major driver for the constant advances in neural networks, and particularly in deep neural networks (DNNs), by significantly reducing the training time, which can take weeks or even months. Distributed training refers to use of multiple computing devices networked together in order to perform training of the neural network. Although distributing training unleashes more compute power, distributed training comes with the cost of inter-node communications that is proportional to the memory needs for the weights of deep neural networks (e.g., AlexNet and ResNet-50 consist of 232 MB and 98 MB of weights, respectively). Moreover, accelerators, which further cut the computation time, can make the cost of communication more pronounced.

FIG. 1A illustrates state-of-the-art distributed training systems structured as a hierarchy of worker-aggregator nodes. Where nodes are referred to herein, it should be understood to refer to computing devices generally that are capable of helping train a neural network. In each iteration of training (which occur repeatedly and often), the aggregator nodes gather the gradient updates from their sub-nodes, communicate the cumulative gradients upwards to further aggregator nodes, and send back updated weights downwards to those sub-nodes. These gradients and weights of real-world DNNs are often hundreds of megabytes (e.g., 525 MB for VGG-16), imposing significant communication loads on the network. Simply using general-purpose compression techniques and developing in-network accelerators for the compression would provide limited gains due to substantial hardware complexity and latency overhead.

BRIEF DESCRIPTION OF THE DRAWINGS

A more particular description of the disclosure will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 3A is a flow chart of a method for aggregating gradient values among a group of neighbor computing devices (nodes) according to an embodiment.

FIG. 3B is a flow chart of a method for aggregating gradient values among three groups of neighbor computing devices according to an embodiment.

FIG. 9 is a flow chart (in pseudo-code) of a method for algorithm execution of gradient-centric distributed training for each computing device of a group of (worker) computing devices in a distributed network according to an embodiment.

FIG. 10 is a flow chart (in pseudo-code) of a method for execution of a compression algorithm for single-precision floating-point gradient according to an embodiment.

FIG. 11 is a flow chart (in pseudo-code) of a method for execution of a decompression algorithm corresponding to the compression algorithm of FIG. 10 according to an embodiment.

DETAILED DESCRIPTION

The present disclosure provides a reduction to the significant communication cost of weights and gradients in neural network distributed training by embedding data compression accelerators in network interface devices such as in network interface cards (NICs), for example. To maximize the benefits of in-network acceleration, the proposed solution provides in-network computing to exchange and process training information of neural networks (e.g., INCEPTIONN) by uniquely combining hardware and algorithmic-based firmware/software exploiting the following three observations. First, gradients are significantly more tolerant to precision loss than weights, and as such, lend themselves better to aggressive compression without the need for complex mechanisms to avert loss. Second, existing training algorithms only communicate gradients in one leg of a distributed hierarchy of computing devices, which reduces the opportunities for in-network acceleration of compression. Third, aggregators can become a bottleneck with compression as they need to compress/decompress multiple streams of data corresponding to each of their sub-nodes, e.g., from their allocated worker group of computing devices.

Building upon the above observations, firmware is adapted to execute a lightweight and hardware-friendly lossy-compression algorithm for floating-point gradient values. This compression exploits a unique value characteristic of gradients: their values mostly fall in the range between −1.0 and 1.0 and the distribution peaks tightly around zero with low variance. Given this observation, the compression (and corresponding decompression) focus on the compression/decompression of floating-point values in the range between −1.0 and 1.0 such that it minimizes precision loss while offering high compression ratio. Moreover, the compression algorithm is developed in view of implementation complexity to enable direct hardware realization in a network interface device. For seamless integration of the in-network accelerators with the existing networking software stack, a host processor may execute a set of application programming interfaces (APIs) that interface the accelerators with traditional transfer control protocol internet protocol (TCP/IP) network stack and open message passing interface (Open-MPI) framework.

Figures 1A, 1B, 1C, 2:
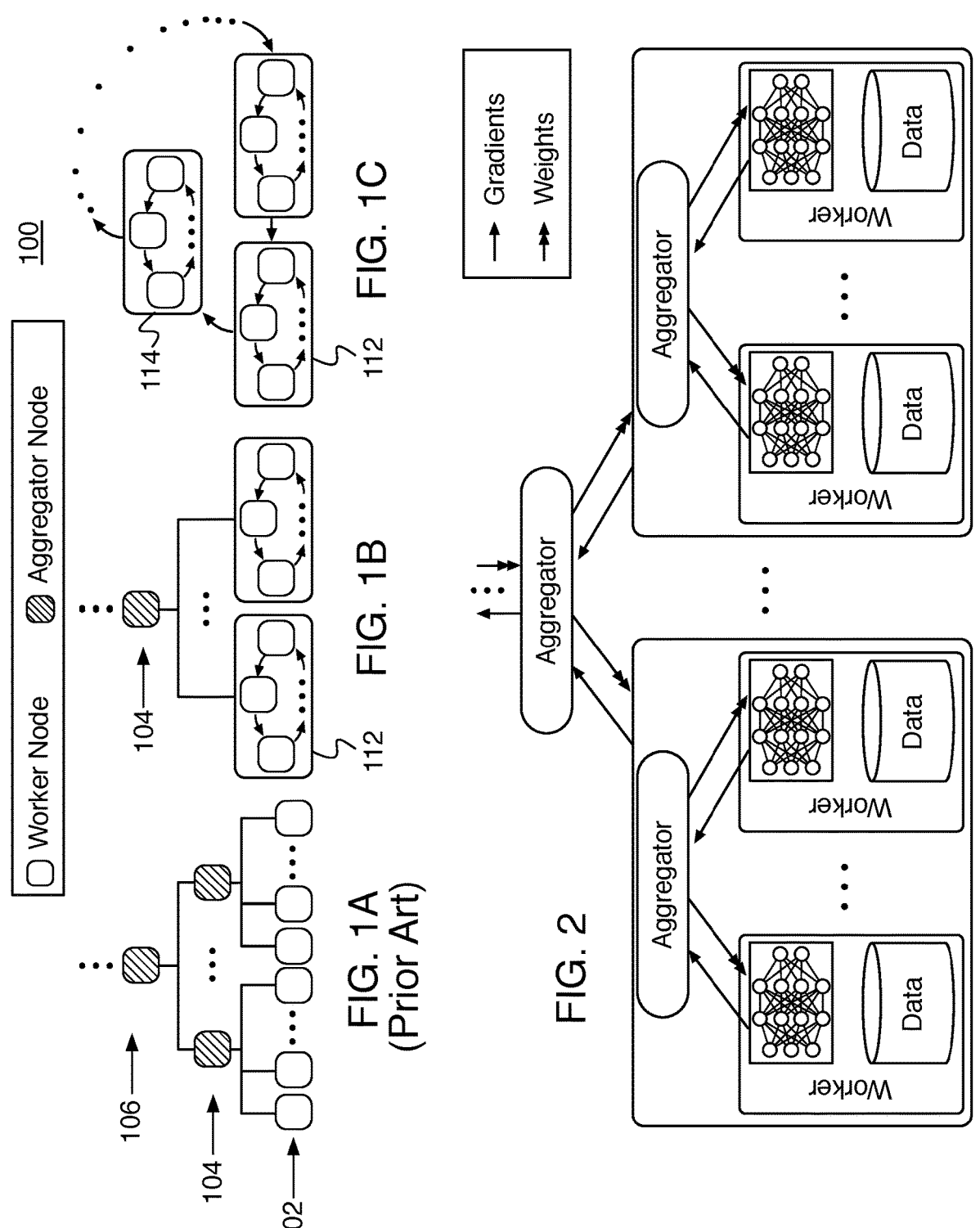
FIG. 1A is a block diagram to illustrate state-of-the-art distributed training systems structured as a hierarchy of worker-aggregator nodes according to one embodiment.
FIG. 1B is a block diagram to illustrate use of a distributed training algorithm within the conventional hierarchy of FIG. 1A according to an embodiment.
FIG. 1C is a block diagram to illustrate use of the distributed training algorithm of FIG. 1B within a hierarchy of training nodes according to an embodiment.
FIG. 2 is a block diagram of a worker-aggregator approach to distributed training according to various embodiments.

As illustrated in FIGS. 1A-1C, and as used herein, "node" makes reference to a computing device that is networked with other computing devices (nodes) within a distributed training network 100. Where the distributed training network 100 is hierarchical, a leaf node 102 is a node at the bottom of the hierarchy and performs computational work to train the neural network algorithm, and is thus sometimes referred to as "worker node" herein. A parent node 104 is networked above the leaf nodes in the hierarchy, a grandparent node 106 is networked above the parent nodes 104, and so on, through multiple levels of the hierarchical training network 100. Parent and grandparent nodes may also be referred to as "aggregator nodes" herein with reference to conventional distributed neural network training (FIGS. 1A-1B). Each of the nodes may be grouped to create a group of computing devices 112 at the leaf node level, a group of computing devices 114 at the parent node level, or a group of computing devices at the grandparent level (not shown), and so forth, each of which may be a worker and aggregator node in a gradient-centric, aggregator-free training algorithm explained herein below. The distributed training network 100, as illustrated in FIG. 1C, however, may also simply include a series of groups of computing devices that are circularly coupled without any specific hierarchal arrangement.

Although compressing gradient values is more effective than compressing weights, benefits of doing so are not fully utilized with conventional distributed training algorithms since such algorithms pass the gradient values in only one leg of a distributed hierarchy of computing devices. This is illustrated in FIG. 1A and FIG. 2 where the gradient values are being passed up directly (and separately) from each group of worker nodes to a chain of aggregator nodes, which become the bottleneck. Moreover, each aggregate node bears the burden of compressing/decompressing multiple streams.

To resolve these challenges, disclosed firmware implements the gradient-centric, aggregator-free training algorithm, which leverages the following algorithmic insight to communicate gradients in each leg of a hierarchical training network of computing devices. The aggregation operator (typically a sum operation) is associative and thus, the gradients can be aggregated gradually by a group of worker nodes. The technique is to pass the partial aggregate from one worker node to the other in a circular manner (e.g., where the computing devices are circularly coupled) while each adds its own contribution to the partial aggregate. The disclosed algorithm eliminates the need for a designated aggregator node in groups of computing devices. The disclosed algorithm further enables the distributed nodes to only communicate gradients (not weights) and equally share the load of aggregation, which provides more opportunities for compressing gradients and improved load balance among the nodes of the distributed training network 100.

FIG. 1B is a block diagram to illustrate use of a distributed training algorithm within the conventional hierarchy of FIG. 1A according to an embodiment. FIG. 1B visually illustrates the grouping view of the disclosed algorithm when the algorithm only replaces the leaf groups (e.g., the group of computing devices 112) of conventional worker-aggregator hierarchy.

FIG. 1C is a block diagram to illustrate use of the distributed training algorithm of FIG. 1B within a hierarchy of training nodes according to an embodiment. FIG. 1C thus depicts a view when the disclosed algorithm replaces all the levels of hierarchy. These nodes (e.g., computing devices) form a worker group, which include the group of computing devices 112 at the leaf node level and the group of computing devices 114 at the parent node level, each which is the building block of distributed training algorithms as depicted in all three organizations in FIGS. 1A-1C.

The combination of (1) lossy compression algorithm for gradient values, (2) network interface device-integrated compression accelerator, and (3) gradient-centric, aggregator-free training algorithm constructs a cross-stack solution that significantly alleviates the communication bottleneck without affecting the mathematics of DNN training. To demonstrate the efficacy of synergistically integrating the aforementioned three components, we train state-of-the-art DNN models such as AlexNet, VGG-16, and ResNet-50. Our experiments show that this combination of solutions reduces the communication time by 70.9~80.7% and offers 2.2~3.1 times speedup in comparison with the conventional worker-aggregator based system, while achieving the same level of accuracy.

Neural network (and, in particular, DNN) training involves determining weights w of a predictor function $\hat{y}=F(x,w)$, which processes input data x (e.g., camera image) and yields a prediction $\hat{y}$ (e.g., where the function f is to recognize a cat in an image). Supervised training finds w (e.g., for parameters of image processing) by minimizing a loss function $\ell(F(x,w),y^*)$, which compares the ground-truth output $y^*$ with the prediction $\hat{y}=F(x,w)$ for given input data x and current w. Data and ground truth (e.g., correct predictions) are available in a training dataset $\mathcal{D}=\{(x, y^*)\}$ which is considered iteratively for many epochs. The commonly used optimization process for deep neural networks is gradient descent, which updates the weights in the opposite direction of the loss function's gradient, $$g = \frac{\partial \ell_D}{\partial w},$$

where $\ell_\mathcal{D}$ denotes the loss accumulated across all samples in the set $\mathcal{D}$. Hence, the update rule that captures the gradient descent training is as follows:

$$w^{(t+1)} = w^{(t)} - \eta \cdot \frac{\partial \ell_D}{\partial w^{(t)}} = w^{(t)} - \eta \cdot g^{(t)},$$

where $w^{(t+1)}$, $w^{(t)}$, and $g^{(t)}$ denote the next updated weights, the current weights, and the current gradient, respectively. The $\eta$ parameter is the learning rate.

However, contemporary datasets $\mathcal{D}$ do not fit into the memory of a single computer or its GPUs, e.g., the size of popular datasets such as ImageNet is larger than 200 GB. To resolve this challenge, stochastic gradient descent emerged as a popular technique. Specifically, ones randomly samples a subset from $\mathcal{D}$, often referred to as a mini-batch $\mathcal{B}$. Instead of evaluating the gradient g on the entire dataset $\mathcal{D}$, we approximate g using the samples in a given $\mathcal{B}$, i.e., we assume $$g \approx \frac{\partial \ell_B}{\partial w}.$$

To parallelize this training process over a cluster, $\mathcal{D}$ can be divided into partial datasets $\mathcal{D}_i$ which are assigned to corresponding worker node i. Each worker can then draw mini-batch $\mathcal{B}_i$ from its own $\mathcal{D}_i$ to calculate local gradient $$g_i = \frac{\partial \ell_{B_i}}{\partial w}$$

and send $g_i$ to an aggregator node to update the weights as follows:

$$w^{(t+1)} = w^{(t)} - \eta \cdot \sum_i \frac{\partial \ell_{B_i^{(t)}}}{\partial w^{(t)}} = w^{(t)} - \eta \cdot \sum_i g_i^{(t)}.$$

The aggregator node, then, can send back the updated weights $w^{(t+1)}$ to all worker nodes, and training resumes with use of the updated weights. This mathematical formulation avoids moving the training data and only communicates the weights and gradients. Although the weights and gradients are much smaller than the training data, they are still a few hundreds of megabytes and need to be communicated often.

Building on this mathematical ground, there have been many research and development efforts in distributing DNN training. State-of-the-art distributed training algorithms take the hierarchical worker-aggregator approach, as illustrated in FIG. 2. In these algorithms, worker and aggregator nodes construct a tree where the leaf nodes are the worker nodes that compute the local gradient $$\left(g_i^{(t)}\right)$$

and the non-leaf nodes are the aggregator nodes that collect the calculated local gradients to update the weights $(w^{(t)})$ and send back the updated weights $(w^{(t+1)})$ to the worker nodes. The hierarchical reduction tree of aggregator nodes not only effectively disperses the networking and aggregation workload to distributed nodes, but also significantly reduces the size of system-wide data exchange by performing the intermediate aggregations. However, even with this hierarchical approach, each aggregator node should communicate with a group of worker nodes and aggregate the local gradients, which becomes the communication and computation bottleneck. This bottleneck is at least partially resolved with the methods disclosed with reference to FIGS. 3A and 3B.

With additional reference to FIGS. 1B and 1C, FIG. 3A is a flow chart of a method 300 for aggregating gradient values among a group of neighbor computing devices (nodes) according to an embodiment. The method 300 may be performed by a group of neighbor computing devices (e.g., worker nodes) within the distributed training network, e.g., the group of computing devices 112 (leaf nodes), the group of computing devices 114 (parent nodes), or a group of grandparent nodes (see FIGS. 1B-1C). Each computing device of the group of neighbor computing devices may be coupled to two neighbor computing devices, which are computing devices located nearby within the distributed training network 100 and logically grouped for purposes of training and gradient aggregation. In some embodiments, the computing devices may be circularly coupled such that a last numbered of the first group of computing devices is coupled to a first numbered of the first group of computing devices.

The method 300 may begin with each computing device of a first group of computing devices aggregating gradient values received from a first neighbor computing device to generate a partial aggregate of gradient values that are to train a neural network algorithm (305). The method 300 may continue with each computing device of the first group of computing devices transferring (e.g., communicating) the partial aggregate of gradient values to a second neighbor computing device (310). The method 300 may continue with each computing device of the first group of computing devices repeating operations 305 and 310 until a first aggregate of gradient values from the first group of computing devices is buffered at a first computing device of the first group of computing devices (320). The method 300 may continue with the first computing device transferring the first aggregate of gradient values to a second group of computing devices of the distributed network (325). In some embodiments, each computing device of the first group of computing devices is further to receive new gradient values simultaneously with transferring the partial aggregate to the second neighbor computing device, and wherein the new gradient values received from the first neighbor computing device are a previous partial aggregate of gradient values.

With additional reference to FIG. 1C, FIG. 3B is a flow chart of a method 301 for aggregating gradient values among three groups of neighbor computing devices according to an embodiment. The method 301 may begin with each computing device of a second group of computing devices (e.g., leaf nodes) repeating operations 305 and 310 until a second aggregate of gradient values from the second group of computing devices is buffered at a second computing device of the second group of computing devices (330). The method 301 may continue with the second computing device aggregating the first aggregate of gradient values with the second aggregate of gradient values to generate a third aggregate of gradient values (335). The method 301 may continue with the second computing device transferring the third aggregate of gradient values to a third group of computing devices (340). If the distributed training network 100 is organized in a hierarchy, then the third group of computing devices may be a leaf node or a parent node in different embodiments.

With additional reference to FIG. 3B, the method 301 may continue with each computing device of the third group of computing devices repeating operations 305 and 310 until a fourth aggregate of gradient values is buffered at a third computing device of the third group of computing devices (345). The method 301 may continue with the third computing device aggregating the fourth aggregate of gradient values with the third aggregate of gradient values to generate a fifth aggregate of gradient values (350). The method 301 may continue with the third computing device transferring the fifth aggregate of gradient values to a fourth group of computing devices (355).

In various embodiments, the fourth group of computing devices may be a grandparent node, a second parent node, or come full circle to be transferred back to a leaf node depending on where the fourth group of computing devices is located within the hierarchy of the distributed training network 100. In this way, parent and grandparent nodes may also be worker nodes and continue to pass an aggregate of the gradient values along to other groups of computing devices within the hierarchical training network 100. In other embodiments, the distributed training network 100 may be organized without a hierarchy and simply be organized in groups of computing devices being circularly coupled to each other. Accordingly, there is no need for hierarchical organization of worker nodes, unless convenient in relation to actual network topology.

In disclosed embodiments, the three groups of aggregation (from the first, second, and third groups of computing devices) can run in parallel, as illustrated in FIG. 1C for example. After local group aggregation occurs, the aggregation result from each group of computing devices may be further aggregated to form globally aggregated gradient values. Also, after the aggregation is completed globally, the resulting aggregated gradient values may be redistributed back along the reverse path as the aggregation such that each computing device (node) receive the resulting aggregated gradient values.

As a further embodiment, each computing device of the fourth group of computing devices may repeat 305 and 310 until a sixth aggregate of gradient values is buffered at a fourth computing device of the fourth group of computing devices. The fourth computing device may aggregate the sixth aggregate of gradient values with the fifth aggregate of gradient values to generate a seventh aggregate of gradient values; and transfer the seventh aggregate of gradient values back to the third group of computing devices to update gradient values of each computing device of the third group of computing devices. The third group of computing devices may then transfer the seventh aggregate of gradient values back to the second group of computing devices, and so forth, until each group of computing devices has the global (e.g., seventh) aggregate of gradient values.

Figures 4A, 4B, 5:
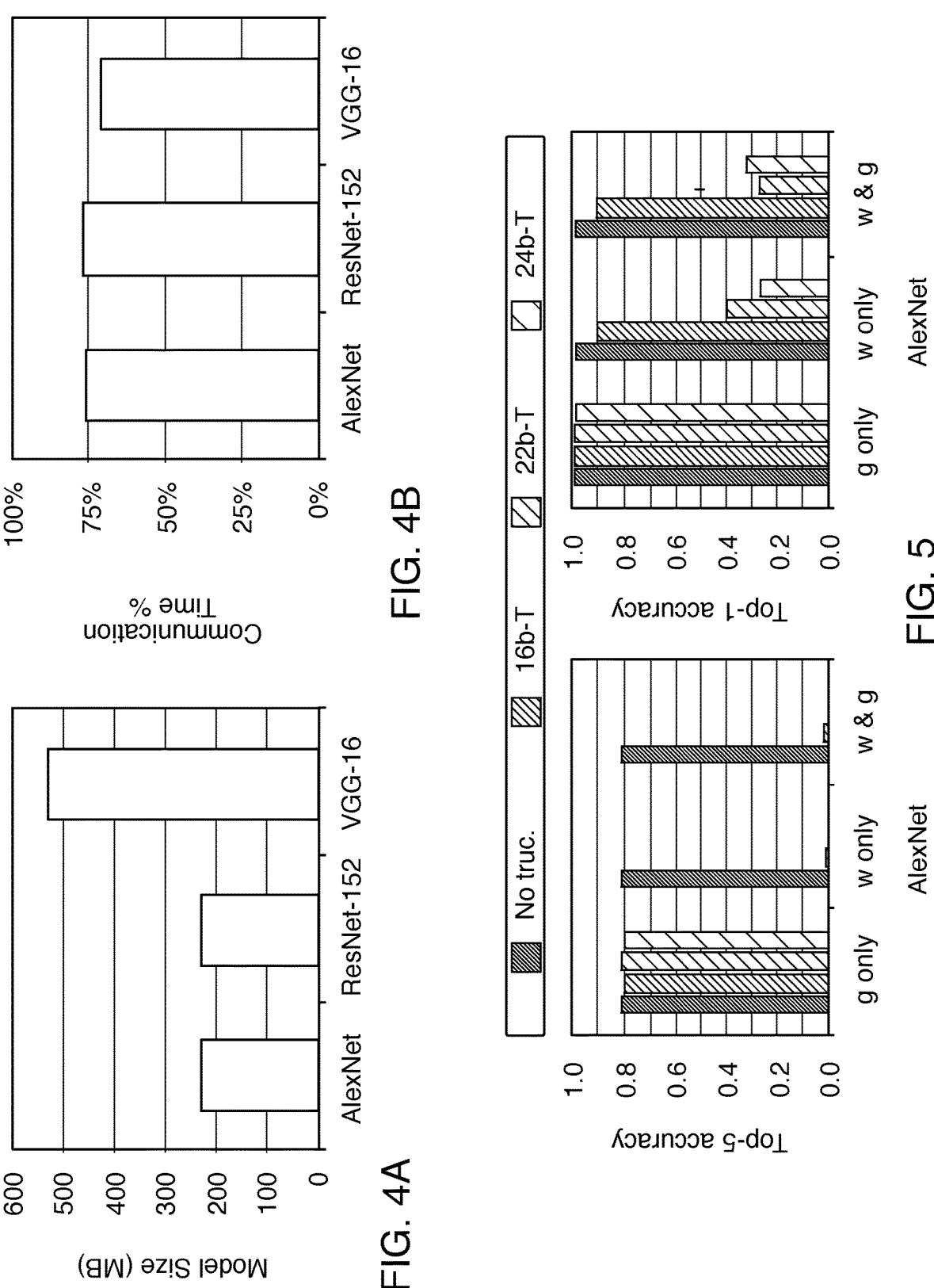
FIG. 4A is a graph illustrating the size of weights and gradients of a few of the popular neural network models according to various embodiments.
FIG. 4B is a percentage of the time spent to exchange (communicate) gradients and weights with respect to total training time with a conventional worker-aggregator hierarchy approach according various embodiments.
FIG. 5 is a set of graphs, one for each of two types of neural network models, to illustrate the impact of floating point truncation of weight (w) only, gradient (g) only, and both weight (w) and gradient (g) on training accuracy, according to two embodiments.

FIG. 4A is a graph illustrating the size of weights and gradients of a few of the popular neural network models according to various embodiments. FIG. 4B is a percentage of the time spent to exchange (communicate) gradients and weights with respect to total training time with a conventional worker-aggregator hierarchy approach according to various embodiments. The DNN training are executed on a five-node cluster with 10 Gb Ethernet connections.

By observing the results, per iteration for example, AlexNet requires 233 MB of data exchange for each of gradients and weights. Due to the large size of data exchange, 75% of training time for AlexNet goes to the communication, which is a very large percentage and a significant factor in delay of training DNNs. Some recent DNNs (e.g., ResNet-50: 98 MB) that have smaller sizes than AlexNet are also included in our evaluations. Nonetheless, as the complexity of tasks moves past simple object recognition, the DNNs are expected to grow in size and complexity. The communication/computation ratio becomes even larger as the specialized accelerators deliver higher performance and reduces the computation time and/or more nodes are used for training.

To reduce the communication overhead, disclosed embodiments may position a compression accelerator in network interface devices such as NICs. Utilizing conventional compression algorithms for acceleration is suboptimal, as the complexity of algorithms will impose significant hardware cost and latency overhead. Thus, in designing the compression algorithm, we leverage the following algorithmic properties: (1) gradients have significantly larger amenity to aggressive compression compared to weights, and (2) gradients mostly fall in the range between −1.0 and 1.0, where the distribution peaks tightly around zero with low variance. These characteristics motivate the design of our lossy compression for gradients.

In some embodiments, both weights (w) and gradients (g) in distributed training are 32-bit floating-point values, whereas may be 16-bit or 32-bit fixed-point values in the inference phase. It is known that floating-point values are not very compressible with lossless compression algorithms. For instance, using Google's state-of-the-art lossless compression algorithm, Snappy, not only offers a poor compression ratio of about 1.5, but also increases the overall time spent for the training phase by a factor of two due to the computing overhead of compression. Thus, we employ a more aggressive lossy compression, exploiting tolerance of DNN training to imprecise values at the algorithm level. While lossy compression provides higher compression ratios and thus larger performance benefits than lossless compression, it will affect the prediction (or inference) accuracy of trained DNNs. To further investigate this, we perform an experiment using a simple lossy compression technique: truncating some least significant bits (LSBs) of the g and w values.

FIG. 5 is a set of graphs, one for each of two types of neural network models, to illustrate the impact of lossy compression (e.g., floating point truncation) of weight (w) only, gradient (g) only, and both weight (w) and gradient (g) on training accuracy, according to two embodiments, e.g., based on training of AlexNet and handwritten digital classification (HDC) net. The results show that the truncation of g affects the predictor accuracy significantly less than that of w, and the aggressive truncation of w detrimentally affects the accuracy for complex DNNs such as AlexNet. This phenomenon seems intuitive since the precision loss of w is accumulated over iterations while that of g is not.

Figure 6:
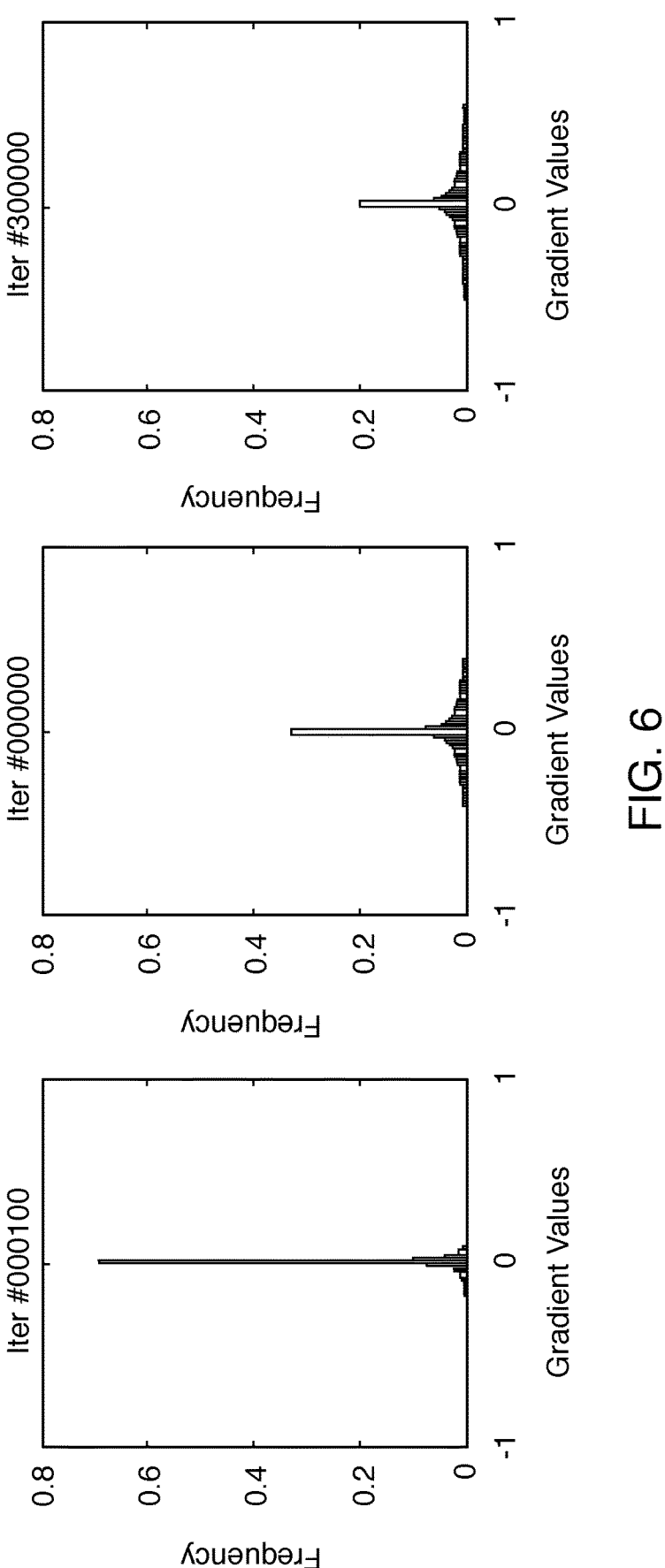
FIG. 6 is a set of graphs that illustrate the distribution of AlexNet gradient values at early, middle, and final training stages, according to an embodiment.

In designing the lossy compression algorithm, we leverage the inherent numerical characteristics of gradient values, e.g., the gradient values mostly fall in the range between minus one ("−1.0") and one ("1.0") and the distribution peaks tightly around zero with low variance. We demonstrate the properties, analyzing the distribution of gradients at three different phases during the training of AlexNet. FIG. 6 is a set of graphs that illustrate the distribution of AlexNet gradient values at early, middle, and final training stages, according to an embodiment. As plotted, all the gradient values are between −1 and 1 throughout the three training phases and most values are close to 0. We also find a similar distribution for other DNN models. Given this observation, we focus on the compression of floating-point values in the range between −1.0 and 1.0 such that the algorithm minimizes the precision loss.

The disclosed lossy compression algorithm (discussed in detail with reference to FIGS. 10-11) may be built upon these two properties of gradients, and may seek to deal with gradient values to the exclusion of weight values. Gradients, however, are only communicated in one direction in conventional distributed training while the updated weights are passed around in the other direction. Therefore, before delving into the details of our compression technique and corresponding hardware, we first discuss the disclosed training algorithm that communicates gradients in all the directions. Hence, this algorithm can maximize the benefits of the disclosed in-network acceleration of gradient values.

Figure 7:
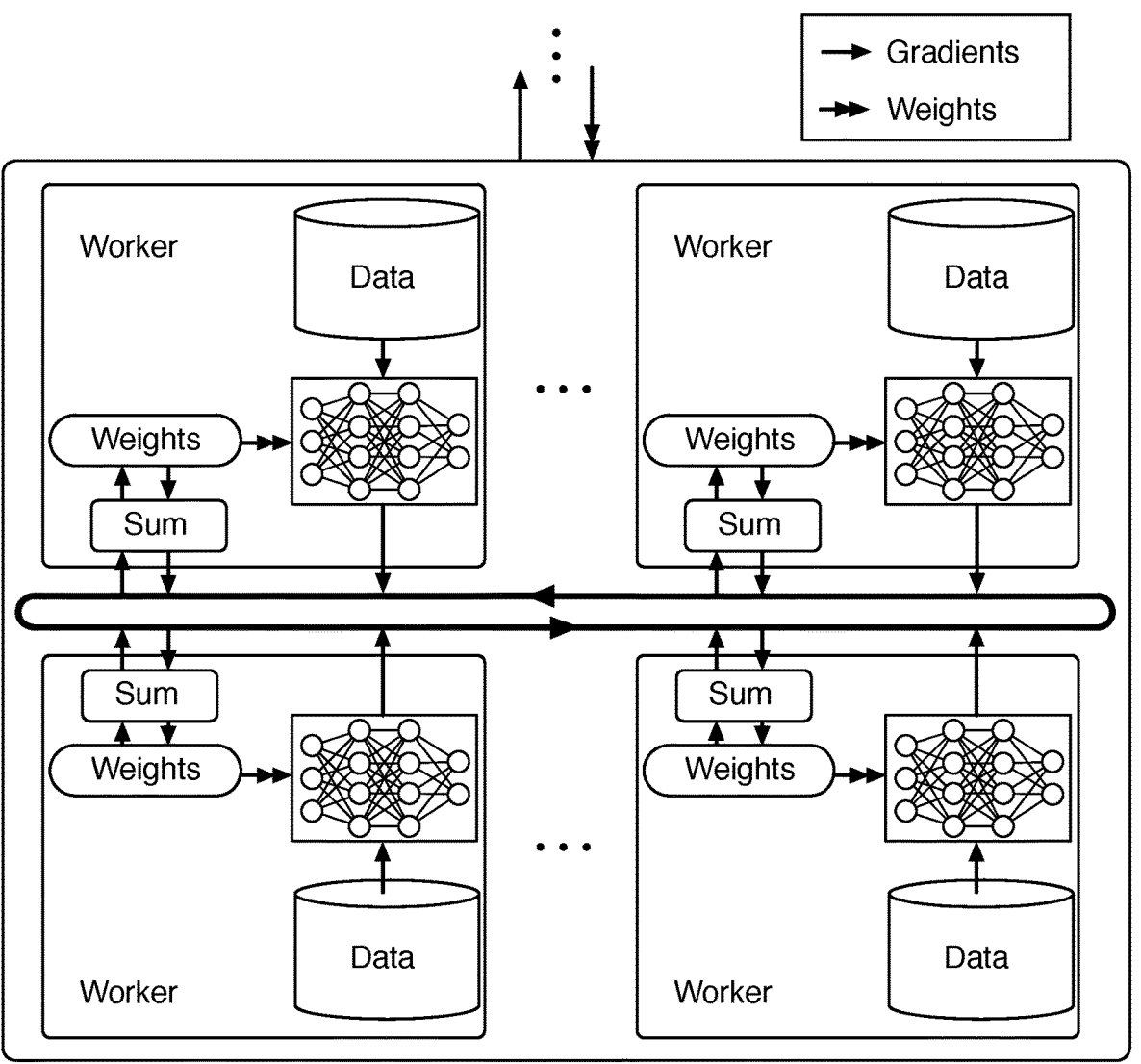
FIG. 7 is a graph illustrating worker neighbor computing devices in a group organization according to ring architecture according to an embodiment.

FIG. 7 is a graph illustrating worker neighbor computing devices in a group organization according to ring architecture according to an embodiment, and thus reflects at least one way of organizing computing devices for the disclosed training Algorithm 1 (see FIG. 9). In Algorithm 1, there is no designated aggregator node in the worker group. Instead, each worker node maintains its own model w (e.g., model replica), and only exchanges and aggregates a subset of gradients g with two neighboring nodes after each iteration.

Figure 8:
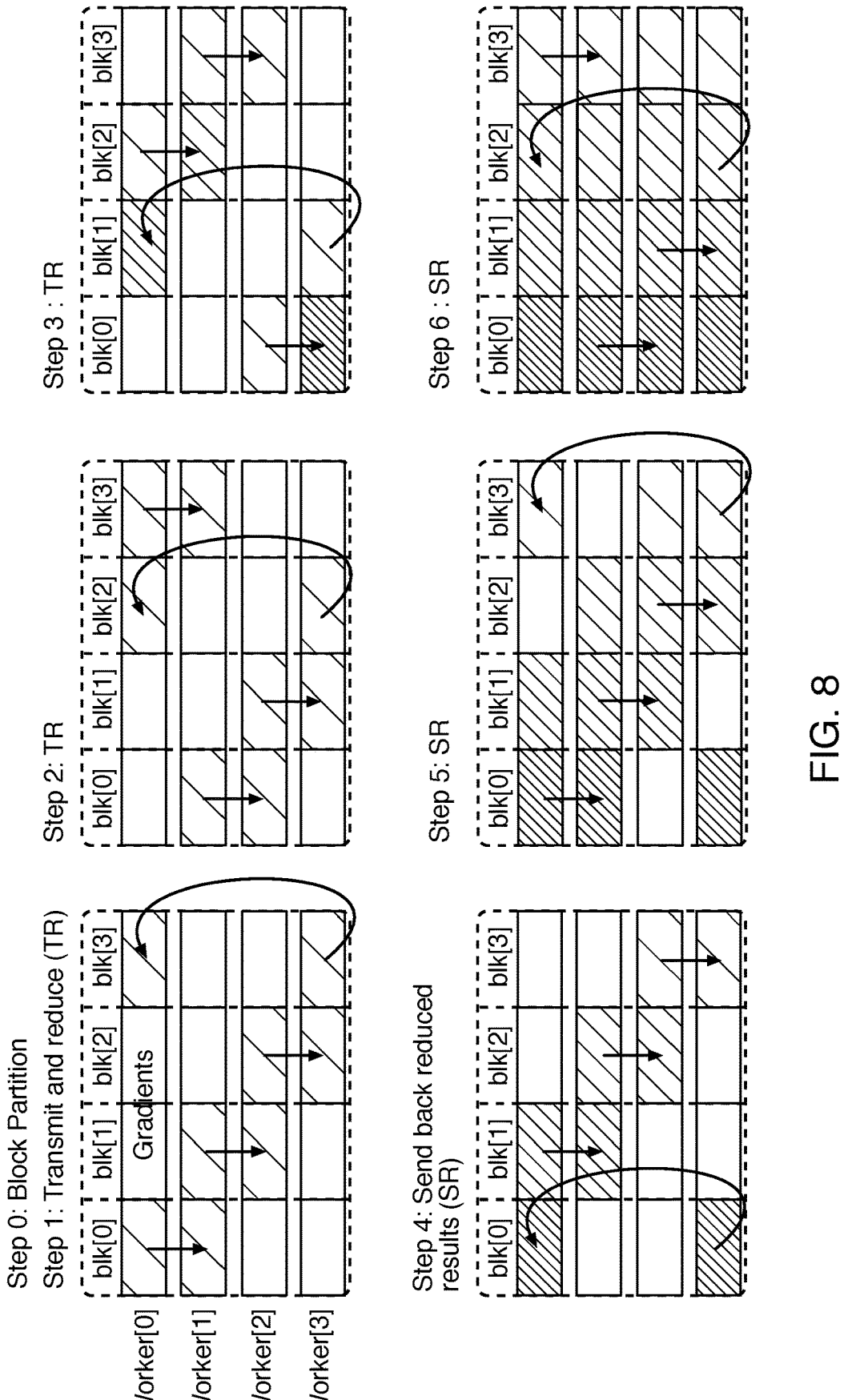
FIG. 8 is a set of graphs, one for each of a number of steps that illustrate the function of the gradient-centric distributed training algorithm among neighbor computing devices in the group organization of FIG. 7 according to an embodiment.

FIG. 8 is a set of graphs, one for each of a number of steps that illustrate the function of the gradient-centric distributed training algorithm among neighbor computing devices in the group organization of FIG. 7 according to an embodiment. At the beginning, each neighbor computing device (e.g., worker node) may start with the same set of weights ($w_0$) for a predictor. Each worker node may evenly partitions a gradient vector into four blocks, e.g., blk[0], blk[1], blk[2], blk[3] for each of four worker nodes. Use of four worker nodes is merely by way of example, as the number of worker nodes may be increased (or decreased) in different embodiments. For each training iteration, each node may load and compute a mini-batch of data based on the current set of weights (w) and then generates a local gradient vector (g) to be exchanged.

Subsequently, the distributed training network 100 may exchange and aggregate gradient values (g) in two phases, which are built into the method of Algorithm 1 in FIG. 9, e.g., at lines 9-13 and at lines 14-18, respectively. With additional reference to FIGS. 8-9, the first phase may perform aggregation of gradient values across worker nodes, and the second phase may perform propagation of the aggregated gradient values across worker nodes, until each worker node has an aggregated vector of gradient values from across all the worker nodes.

More specifically, phase one may begin with each computing device receiving a first numbered block, of the multiple blocks of gradient values, from a neighbor worker node. For example, worker[1] may receive blk[0] from worker[0], worker[2] receive blk[1] from worker[1], worker[3] receive blk[2] from worker[2], and worker[0] receive blk[3] from worker[3] (Step 1). (Because the worker nodes are circularly coupled, each worker node simultaneously sends a block to a neighbor worker nodes as well, as also outlined in the preceding sentence, using the full duplex capability of each network interface device.) Each worker node may then perform sum-reduction on the received first numbered block and its own first numbered block, to generate an updated owned numbered block. For example, worker[1] may perform sum-reduction (e.g., add two vectors of gradient values together to generate a single vector of aggregated gradient values) on the received blk[0] and its own blk[0], to generate updated blk[0']. This concurrently occurs across all four worker nodes in a cascaded manner, as illustrated in FIG. 8.

In various embodiments, Step 1 is repeated two more times (at Step 2 and Step 3), or more times if employing more than four worker nodes. For example, Step 1 may be repeated across the multiple numbered blocks of each computing device in a cascaded manner using, at each iteration of sum-reduction, a received updated numbered block and an own updated numbered block, until each worker node has a different subset of an aggregate of gradient values.

In phase two, the worker nodes may perform propagation of the aggregated gradient values across themselves, until each worker node has an aggregated vector of gradient values from across all the worker nodes. More specifically, each worker node may propagate a first subset of the aggregate of gradient values to a different-numbered computing device (e.g., worker node). Each worker node simultaneously receives a second subset of the first aggregate of gradient values from a different-numbered worker node. For example, worker[3] sends blk[0] (now aggregated) to worker[0], but receives blk[3] from worker[2]. Now worker [0] has blk[0] and blk[1] and worker[3] has blk[0] and blk[3]. This propagation may be concurrently repeated in a cascaded manner across the worker nodes until each worker node has the aggregate of gradient values from all four worker nodes (Step 6). Algorithm 1 illustrated in FIG. 9 generalizes this distributed training for an arbitrary number of worker nodes, where the ⊕ denotes sum-reduction.

In summary, the disclosed training Algorithm 1 utilizes the network bandwidth of every worker evenly unlike the worker-aggregator approach, thus resolving the communication bottleneck of the worker-aggregator approach. Furthermore, Algorithm 1 performs the computation for aggregating gradients across workers in a decentralized manner, avoiding the computation bottleneck at a particular node. Lastly, Algorithm 1 can be efficiently implemented with popular distributed computing algorithms such as Ring AllReduce.

FIG. 10 is a flow chart (in pseudo-code) of a method for execution of a compression algorithm, referred to herein as Algorithm 2, for single-precision floating-point gradient according to an embodiment. Algorithm 2 elaborates the procedure of compressing a 32-bit floating-point gradient value (f) into a compressed bit vector (v) and a 2-bit tag (t) indicating the used compression mechanism. Note that Algorithm 2 is described based on the standard IEEE 754 floating-point representation, which splits a 32-bit value into 1 sign bit (s), 8 exponent bits (e), and 23 mantissa bits (m). Depending on the range where f falls in, the algorithm chooses one of the four different compression mechanisms.

In various embodiments, if f is larger than 1.0 (i. e., $e \geq 127$), Algorithm 2 does not compress the floating-point gradient value and keeps the original 32 bits (NO-COMPRESS). If f is smaller than an error bound, Algorithm 2 does not keep any bits from f (0BIT-COMPRESS). When the gradient values are in the range (error-bound<f<1.0), Algorithm 2 should take a less aggressive approach since we need to preserve the precision. In one example, the error-bound is $2^{-10}$, $2^{-8}$, $2^{-6}$, or the like other small number. The simplest approach would be to truncate some LSB bits from the mantissa. However, this approach not only limits the maximum obtainable compression ratio since we need to keep at least 9 MSB bits for sign and exponent bits, but also affects the precision significantly as the number of truncated mantissa bits increases. Instead, Algorithm 2 is designed to set e to 127 and to not include (e.g., excluding) the exponent bits in the compressed bit vector. Normalizing e to 127 is essentially multiplying $2^{(127-e)}$ (as a multiplicand value) to the input value. Algorithm 2, therefore, may remember the multiplicand so that it can be decompressed. To encode this information, Algorithm 2 concatenates a 1-bit ('1') at the MSB of m and shifts it to the right by 127-e bits. Algorithm 2 may then truncate some LSB bits from the shifted bit vector and keep either 8 or 16 of the MSB bits depending on the range of values. Consequently, the compression Algorithm 2 produces the compressed bit vector (v) with the size of either 32, 16, 8, or 0 and a 2-bit tag, which indicates the used compression mechanism.

FIG. 11 is a flow chart (in pseudo-code) of a method for execution of a decompression algorithm, referred to herein as Algorithm 3, corresponding to the compression algorithm of FIG. 10 according to an embodiment. Algorithm 3 describes the decompression algorithm that takes a compressed bit vector v and a 2-bit tag t and generates a decompressed floating-point gradient value f. When t is NO COMPRESS or 0BIT_COMPRESS, the decompressed output is simply 32-bit v or zero, respectively. If t is 8BIT_COMPRESS or 16BIT_COMPRESS, Algorithm 3 is to reconstruct the 32-bit IEEE 754 floating-point value f from v. First, Algorithm 3 may obtain the sign bit s by taking the first bit of v. Algorithm 3 may then find the distance from the MSB to the first "1" in v, which is the multiplicand used for setting the exponent to 127 during compression. Once Algorithm 3 obtains the distance, e can be calculated by subtracting the distance from 127. Algorithm 3 may next obtain m by shifting v to left by the distance and padding the LSBs of v with zeros to fill the truncated bits of the mantissa during compression. Since Algorithm 2 now has s, e, and m, Algorithm 2 can concatenate them together as a 32-bit IEEE 754 floating-point value and return it as the decompression output.

Figure 12A:
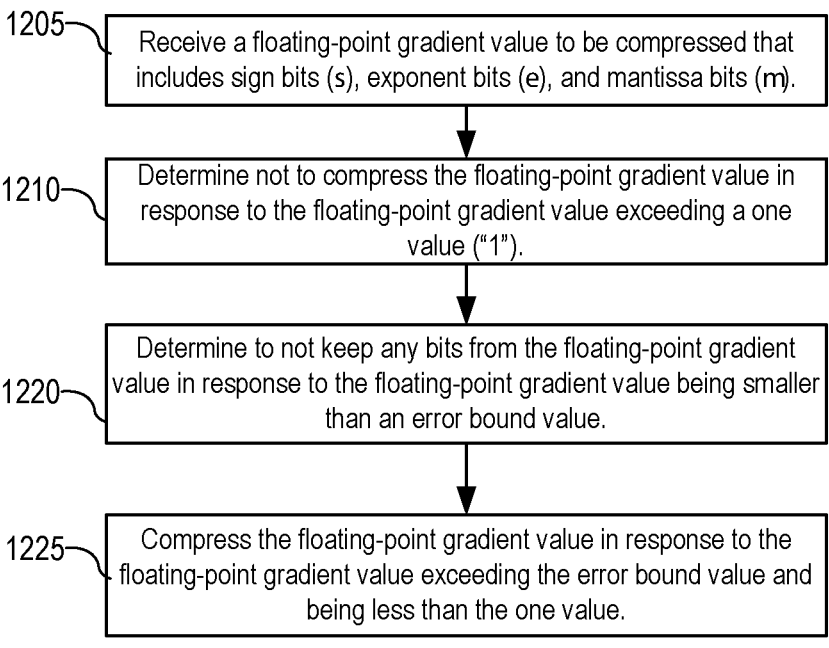
FIGS. 12A-12B are flow charts of a method for execution of the compression algorithm of FIG. 10 according to an embodiment.
Figure 12B:
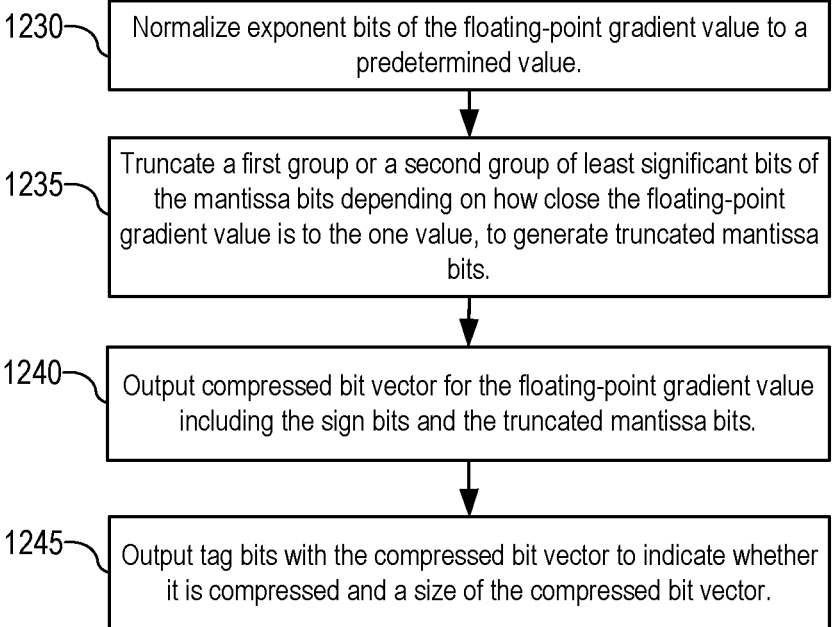

FIGS. 12A-12B are flow charts of a method 1200 for execution of the compression algorithm of FIG. 10 according to an embodiment. The method 1200 may be performed by processing logic that may comprise hardware (e.g., circuitry, dedicated logic, programmable logic, microcode, etc.), firmware, or a combination thereof. In one embodiment, the method 1200 is performed by the compression engine (1522, FIG. 15).

In various embodiments, the method 1200 begins with the processing logic receiving a floating-point gradient value to be compressed that includes sign bits (s), exponent bits (e), and mantissa bits (m) (1205). The method 1200 may continue with the processing logic determining not to compress the floating-point value in response to the floating-point gradient value exceeding a one value ("1") (1210). The method 1200 may continue with the processing logic determining to not keep any bits from the floating-point gradient value in response to the floating-point gradient value being smaller than an error bound value (1220). The method 1200 may continue with the processing logic compressing, by the compression engine, the floating-point gradient value in response to the floating-point gradient value exceeding the error bound value and being less than the one value (1225).

With continued reference to FIG. 12B, the method 1200 may continue, as an extension to operation 1225, with the processing logic normalizing the exponent bits of the floating-point gradient value to a predetermined value (1230). The predetermined value may be 127 and a multiplicand value of $2^{(127-e)}$ may be employed to perform the normalizing. The method 1200 may continue with the processing logic truncating one of a first plurality or a second plurality of least significant bits of the mantissa bits depending on how close the floating-point gradient value is to the one value, to generate truncated mantissa bits (1235). In embodiments, the first plurality of least significant bits may be fifteen bits when the exponent value is greater than or equal to the error bound value plus half of 127 minus the error bound value (Algorithm 2). Further, the second plurality of least significant bits may be seven bits when the exponent value is less than the error bound value plus half of 127 minus the error bound value (Algorithm 2).

With continued reference to FIG. 12B, although not illustrated, the method 1200 may further include the processing logic encoding, within the mantissa bits, the multiplicand value before truncating of the mantissa bits. The method 1200 may continue with the processing logic outputting a compressed bit vector for the floating-point gradient value that includes the sign bits and the truncated mantissa bits (1240). Although not illustrated, the method 1200 may also include the processing logic setting tag bits to indicate either: (i) the floating-point gradient value was not compressed; or (ii) the compressed bit vector contains a value and of what predetermined size. The method 1200 may continue with the processing logic outputting the tag bits with the compressed bit vector to indicate whether it is compressed and a size of the compressed bit vector (1245).

Figure 13:
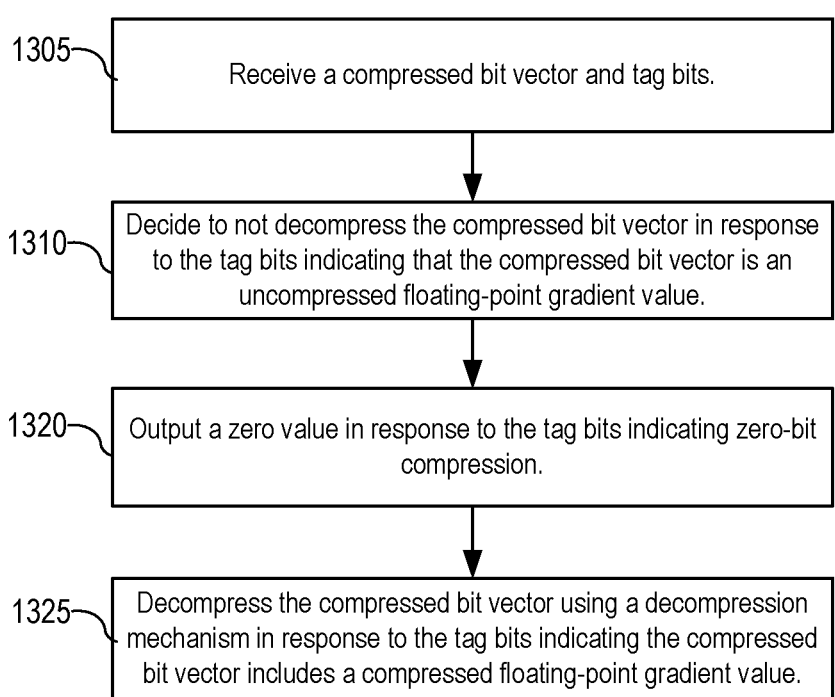
FIG. 13 is a flow chart of a method for execution of the decompression algorithm of FIG. 11 according to an embodiment.

FIG. 13 is a flow chart of a method 1300 for execution of the decompression algorithm of FIG. 11 according to an embodiment. The method 1300 may be performed by processing logic that may comprise hardware (e.g., circuitry, dedicated logic, programmable logic, microcode, etc.), firmware, or a combination thereof. In one embodiment, the method 1300 is performed by the compression engine (1524, FIG. 15).

In various embodiments, the method 1300 begins with the processing logic receiving a compressed bit vector and tag bits for decompression (1305). The method 1300 may continue with the processing logic deciding to not decompress the compressed bit vector in response to the tag bits indicating that the second compressed bit vector is uncompressed floating-point gradient value (1310). The method 1300 may continue with the processing logic outputting a zero value in response to the tag bits indicating zero-bit compression (1320). The method 1300 may continue with the processing logic decompressing, using a decompression mechanism, the second compressed bit vector in response to the tag bits indicating the compressed bit vector is a compressed floating-point gradient value (1325). The tag bits may specify the decompression mechanism, e.g., by indicating a size of the compressed bit vector.

After applying the compression Algorithm 2, we may significantly reduce the amount of data exchanged among nodes, but ultimately the desire is to reduce the total training time. In fact, although researchers in the machine learning community have proposed other compression algorithms, most of them did not report the total training wall-clock time after evaluating only the compression ratio and the impact of compression on training accuracy. Directly running these compression algorithms in software, though reducing the communication time, can place heavy burden on the computation resources and thus seriously increase computation time. Specifically, such compression algorithms that need to run on the CPUs as GPUs cannot offer efficient bit manipulation (e.g., packing some bits from floating-point numbers) compared to CPUs. Prior work shows GPUs offer only about 50% higher throughput at lower compression ratios than Snappy.

Figure 14:
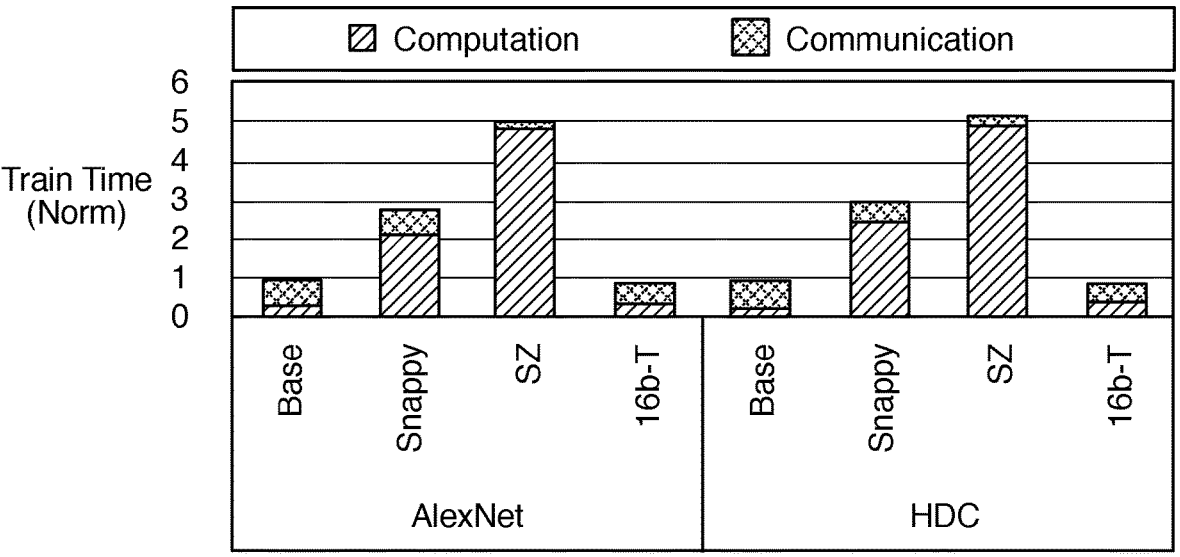
FIG. 14 is a graph that illustrates the impact of software-based lossless (Snappy) and lossy (SZ) compression algorithms in terms of computation and communication in total training time for AlexNet and HDC DNN models according to various embodiments.

FIG. 14 is a graph that illustrates the impact of software-based lossless (Snappy) and lossy (SZ) compression algorithms in terms of computation and communication in total training time for AlexNet and HDC DNN models according to various embodiments. FIG. 14 shows that the training time increases by a factor of two to four times even when using the fastest lossless (Snappy) and lossy (SZ) compression algorithms. Even a simple lossy truncation operation significantly increases the computation time because simply packing/unpacking a large number of g values also significantly burdens the CPUs. This in turn considerably negates the benefit of reduced communication time as shown in FIG. 14, only slightly decreasing the total training time. Therefore, to reduce both communication and computation times, we need hardware-based compression for the disclosed compression and decompression algorithms.

Figure 15:
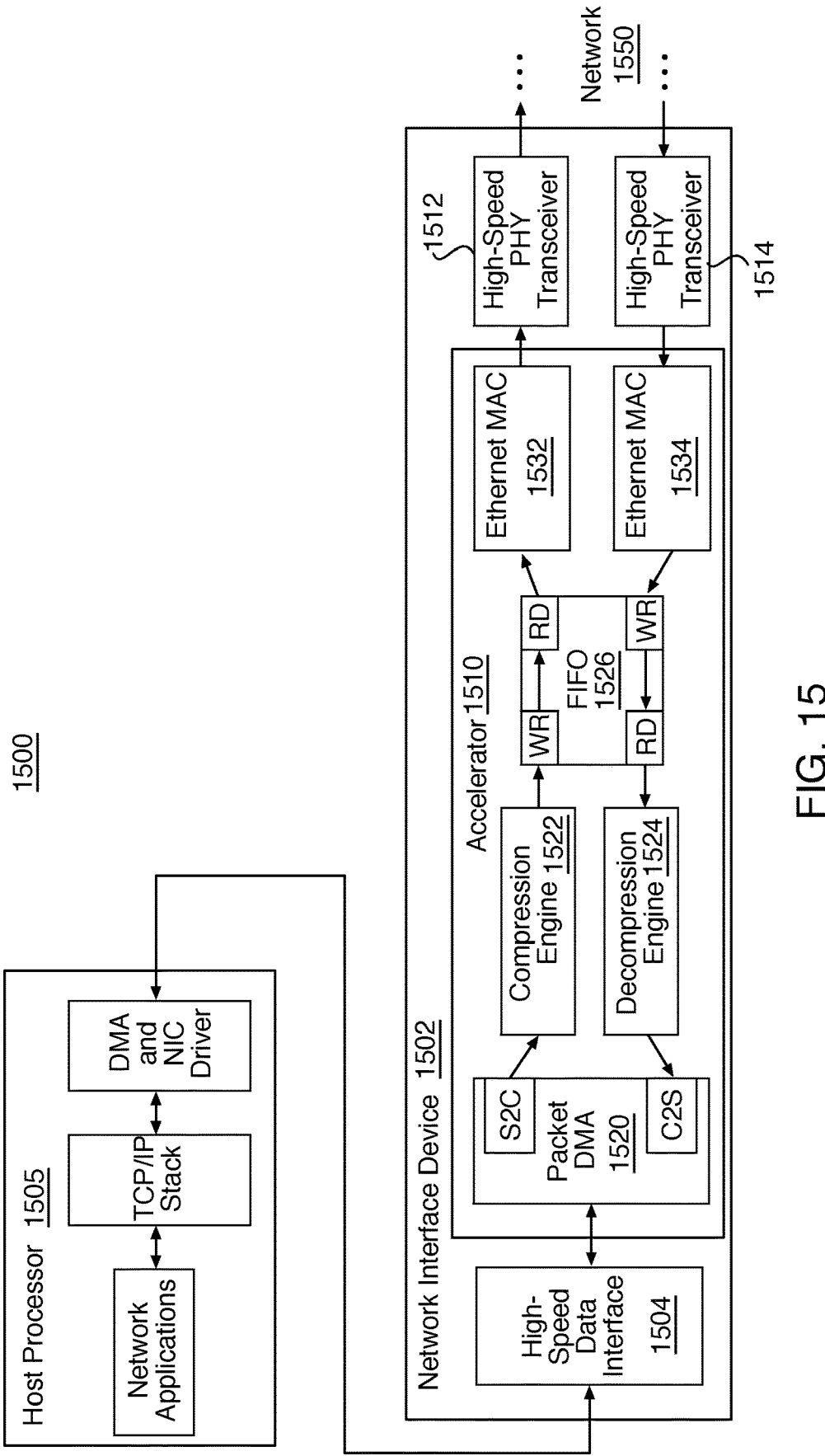
FIG. 15 is a block diagram of a computing device adapted with a network interface device having an accelerator to offload compression and decompression of floating-point gradient values for a host processor according to various embodiments.

FIG. 15 is a block diagram of a computing device 1500 adapted with a network interface device 1502 having an accelerator 1510 to offload compression and decompression of floating-point gradient values for a host processor 1505 according to various embodiments. In various embodiments, the host processor 1505 is to execute network communication applications, run the TCP/IP stack, and execute DMA and NIC (or related) drivers. The network interface device 1502 may be a NIC or other device depending on implementation.

In various embodiments, the network interface device 1502 may further include, but not be limited to, a high-speed data interface 1504 coupled to the host processor 1505 and the accelerator 1510, and a first high-speed physical layer (PHY) transceiver 1512 and a second high-speed PHY transceiver 1514. The high-speed data interface 1504 may be a component adapted with one of Peripheral Component Interconnect Express (PCIe®), External Serial Advanced Technology Attachment (eSATA), Thunderbolt™, Universal Serial Bus (USB™), or the like technology. The high-speed PHY transceivers 1512, 1514 may enable full-duplex communication with a network 1550 and be giga-tether net (GTH) devices in some embodiments. The high-speed PHY transceivers 1512, 1514 may implement physical layer communication protocol in use over the accelerator 1510 and couple a pair of Ethernet medium access controllers (MACs) 1532, 1534 of the accelerator 1510 to the physical medium of the network. In an alternative embodiment, the high-speed PHY transceivers 1512, 1514 are instead programmed as hardware into the accelerator 1510.

In disclosed embodiments, the accelerator 1510 is a reconfigurable logic device such as a Field Programmable Gate Array (FPGA) device, an Application Specific IC (ASIC), or other programmable processor or the like. The accelerator 1510 may include at least a packet direct memory access (DMA) controller 1520, a compression engine 1522, a decompression engine 1524, a first-in-first-out (FIFO) buffer 1526, a first Ethernet MAC 1532, and a second Ethernet MAC 1534. In embodiments, each of these components is programmed as hardware into the accelerator 1510 of the network interface device 1502. The compression engine 1522 may compress outgoing floating-point gradient values from the host processor 1505 to be sent out to the network 1550, e.g., to neighbor computing devices or nodes. The decompression engine 1524 may decompress incoming floating-point gradient values received from the network 1550 to be passed to the host processor 1505 for processing, e.g., training a neural network model. The FIFO buffer 1526 may include multiple FIFO buffers, which are emulated by the accelerator 1510, e.g., are virtual FIFO buffers.

To evaluate the disclosed system in a real world setting, the network interface device 1502 was implemented within a Xilinx VC709 evaluation board that offers 10 Gbps network connectivity along with programmable logic. The accelerator 1510 was inserted within the NIC reference design that comes with the Xilinx VC709 evaluation board. FIG. 15 illustrates the integration of the compression and decompression engines 1522 and 1524 within the accelerator 1510. The compression and decompression engines 1522 and 1524 may not alter the Internet Protocol (IP) headers of network packets being processed, but may just compress/decompress the payload data of the network packets passing through.

In various embodiments, for output traffic, the packet DMA controller 1520 may collect the network packets from the host processor 1505 through a PCIe link coupled to the high-speed data interface 1504. These network packets may then go through the compression engine 1522, which stores the resulting compressed data in the FIFO buffer 1526 that is accessed by the Ethernet MAC 1532. The Ethernet MAC PHYs 1532, 1534 may drive the high-speed PHY transceivers 1512, 1514 of the network interface device 1502 and send or receive the data over the network. For input traffic, the Ethernet MAC 1534 may store the received network packets from the high-speed PHY transceiver 1514 in the FIFO buffer 1526. Once a complete network packet is stored in the FIFO buffer 1526, the decompression engine 1524 decompress payload data, which includes a compressed floating-point gradient vector, to generate a decompressed floating-point gradient value (or vector of values). The decompression engine 1524 may then transfer the decompressed floating-point gradient value(s) to the packet DMA for transfer to the host processor 1505. Both engines may use the standard 256-bit internal bus (e.g., AXI-stream bus) to interact with other modules, although other protocol buses are envisioned in future NICs.

Although hardware acceleration of the compression and decompression algorithms is straightforward, their integration within the network interface device 1502 poses several challenges. These algorithms are devised to process streams of floating-point numbers, while the network interface device 1502 handles TCP/IP packets. Hence, the accelerator 1510 may be customized to transparently process TCP/IP packets. Furthermore, the compression is lossy, so the network interface device 1502 may provide the abstraction that enables the software to activate/deactivate the lossy compression per packet basis, which is discussed in more detail below.

Figure 16:
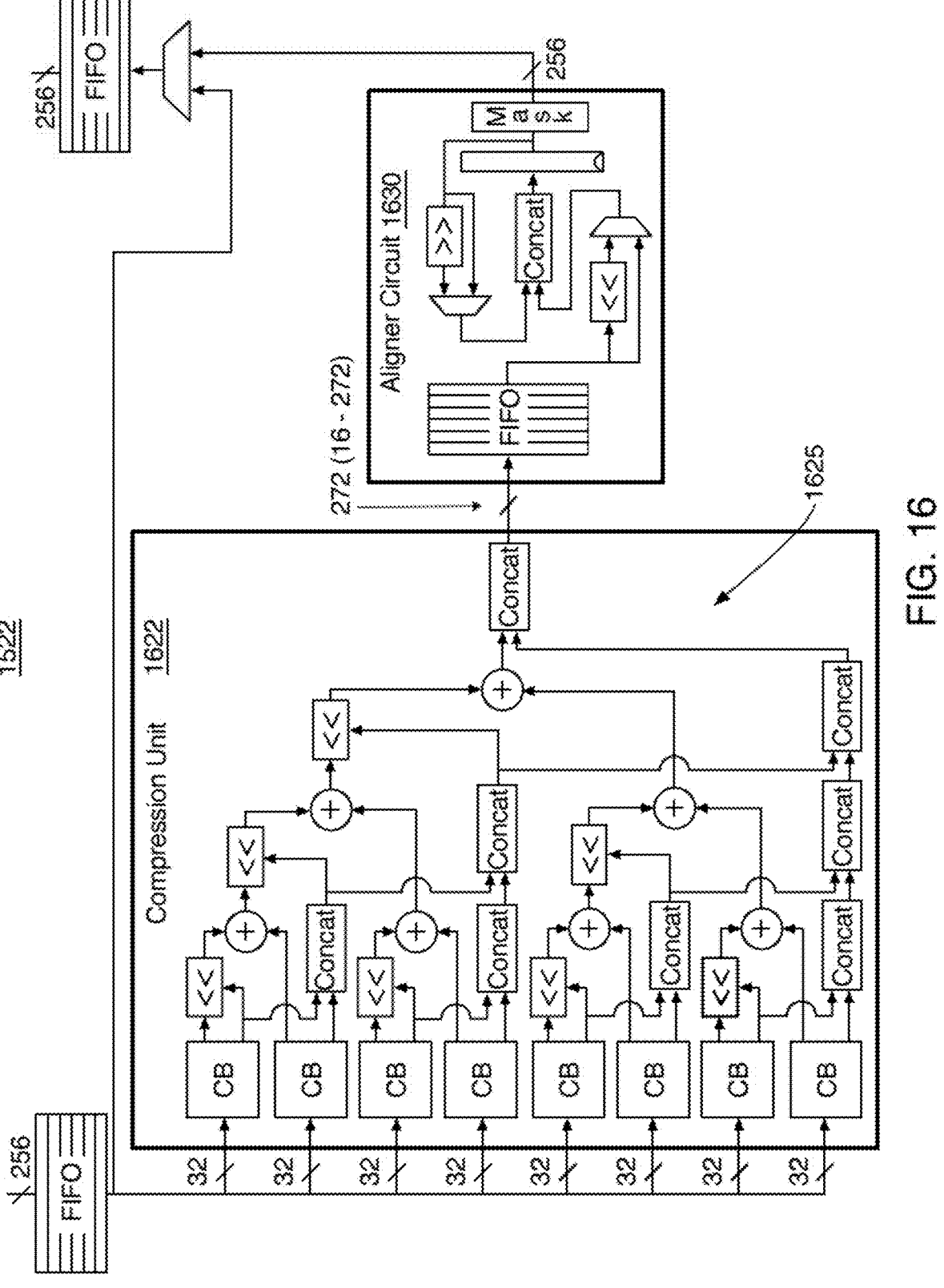
FIG. 16 is a block diagram of a compression engine of the network interface device of FIG. 15 according to an embodiment.

FIG. 16 is a block diagram of the compression engine 1522 of the network interface device 1502 of FIG. 15 according to an embodiment. Not to interfere with the regular packets that should not be compressed, the compression engine 1522 may first identify which network packets are intended for lossy compression. Then, the compressing engine 1522 may extract their data payload, compress the data, and then reattach it to the network packet. The compression engine 1522 processes packets in bursts of a predetermined number of bits, e.g., 256 bits, which is the number of bits an AXI interface can deliver in one cycle. The compression engine 1522 (as well as the decompression engine 1524) may process the packet in this burst granularity to avoid curtailing the processing bandwidth of the NIC. A software API, executable by the host processor 1505, may mark a packet compressible by setting the Type of Service (ToS) field in the header to a special value. Since the ToS field is always loaded in the first burst, the compression engine 1522 may perform the sequence matching at the first burst and identify the compressible packets. If the ToS value does not match, compression is bypassed. The compression engine 1522 also does not compress the header and the compression starts as soon as the first burst of the data payload arrives.

FIG. 16 depicts the architecture of the compression hardware. The payload burst feeds into a compression unit 1622 equipped with multiple (e.g., eight) compression circuit blocks (CB), each of which performs the compression described in Algorithm 2. Each CB may be arranged in parallel and thus each may simultaneously produce a variable-sized compressed output in the size of either 32, 16, 8, or 0 bits, for example, which are to be aligned as a single bit vector. The compression unit 1622 may include a binary shifter tree 1625 that produces the aligned bit vector of which possible size is from 0 to 256 bits, for example. The 2-bit tags of the eight CBs may be concatenated as a 16-bit vector. Finally, the aligned bit vector and tag bit vector are concatenated as a final output of the compression unit 1622, of which size is at least 16 bits and can go up to 272 bits. For each burst, the compression unit produces a variable-sized (e.g., 16-272 bits) bit vector; therefore, these bit vectors are to be aligned so that the compression engine 1522 can transfer the 256-bit burst via the AXI interface. The compression engine 1522 may include an aligner circuit 1630 to accumulate a series of compressed outputs (e.g., compressed output bit vectors) and output a burst when the aligner circuit 1630 has accumulated a number of compressed outputs having a total size of up to the predetermined number of bits, e.g., 256 bits in one embodiment.

Figure 17:
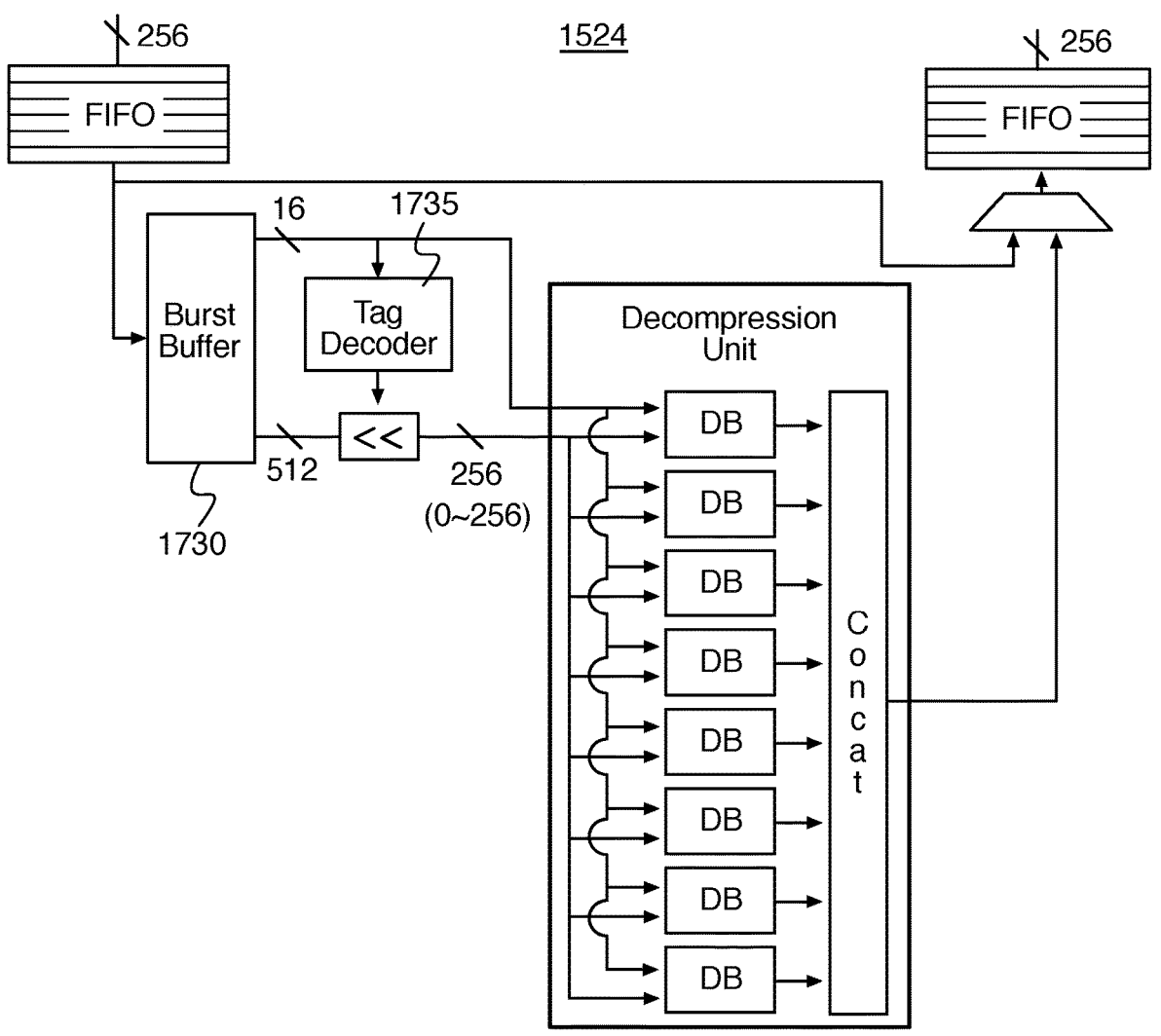
FIG. 17 is a block diagram of a decompression engine of the network interface device of FIG. 15 according to an embodiment.

FIG. 17 is a block diagram of the decompression engine 1524 of the network interface device 1502 of FIG. 15 according to an embodiment. Similar to the compression engine 1522, the decompression engine 1524 processes packets in the ToS field at the first burst. If the packet is identified as incompressible or the burst is header, decompression is burst granularity and identifies whether or not the received packet is compressed through the sequence matching of bypassed. The payload bursts of compressible packets is fed into the decompression hardware, of which its architecture is delineated in FIG. 17.

In various embodiments, because the compressed burst that contains a certain number (e.g., 8) of floating-point numbers can overlap two consecutive bursts at the decompression engine 1524, reading only a single burst could be insufficient to proceed to the decompression. Therefore, the decompression engine 1524 has a burst buffer 1730 that maintains up to two times the predetermined number of bits, e.g., two bursts totaling 512 bits in one embodiment. When the burst buffer 1730 obtains two bursts, the burst buffer 1730 feeds the 16-bit tag vector to a tag decoder 1735 to calculate the size of the eight compressed bit vectors. Given the sizes, the eight compressed bit vectors are obtained from the buffered 512 bits. Because each compressed bit vector has a variable size of either 32, 16, 8, or 0 bits, the possible size of the eight compressed bit vectors is from 0 and 256.

In embodiments, these eight compressed bit vectors (0-256 bits) and the tag bit vector (16 bits) are fed into multiple (e.g., eight) decompression circuit blocks (DBs) in a decompression unit 1724. Each of the DBs may decompress in parallel and execute the decompression algorithm described in Algorithm 3. Then, the decompression unit 1724 may concatenate the outputs from the eight DBs to generate a concatenated bit vector of the incoming floating-point gradient values, and transfer the concatenated bit vector of floating-point gradient values via the AXI interface. For the next cycle, the burst buffer 1730 shifts away the consumed bits and reads the next burst if a burst (e.g., 256 bits) has been consumed and the remaining bits are fewer than a burst. Because each CB and each DB operates independently, the disclosed compression and decompression engines 1522, 1524 may leverage a high level of parallelism, further reducing the time required for compression and decompression, respectively.

Figure 18:
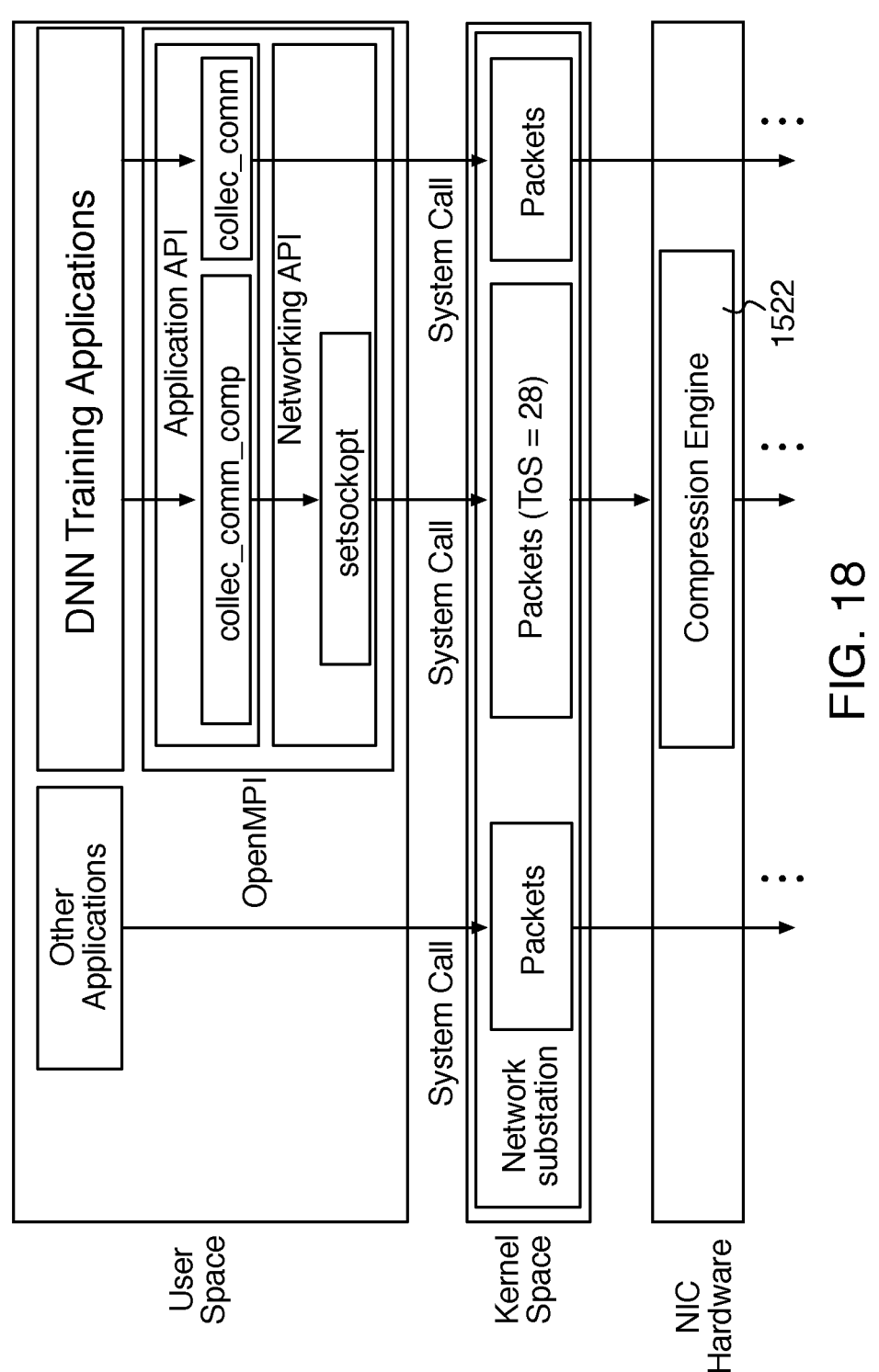
FIG. 18 is a flow chart of data flow across a software stack, kernel space, and network interface device hardware of a computing device adapted to perform distributed training of a neural network algorithm according to various embodiments.

FIG. 18 is a flow chart of data flow across a software stack, kernel space, and network interface device hardware of a computing device adapted to perform distributed training of a neural network algorithm according to various embodiments. As mentioned previously, the network interface device 1502 and the host processor 1505 may identify the context of a TCP/IP packet by utilizing the ToS field in the IP header. The ToS may be an 8-bit field in the header of a TCP/IP packet and be used to prioritize different TCP/IP streams. The system hardware may tag packets that need to be compressed/decompressed with a reserved ToS value such as 0x28. For each socket connection, the host processor 1505 can call the setsockopt function to set the ToS field or update it on the fly.

FIG. 18 demonstrates how to tag TCP/IP packets that are to be compressed or decompressed in the OpenMPI framework. FIG. 18 illustrates a scenario where we co-run DNN training application and some other networking applications on a server. To properly tag TCP/IP packets that call for compression or decompression, we introduce MPI_collective communication_comp, which may be understood to be a specialized MPI_collective communication application programming interface (API) set. We implement Algorithm 1 (FIG. 9) without compression with the default MPI_collective_communication APIs. MPI collective_communication comp may propagate a variable down to the OpenMPI networking APIs and set the ToS option of the corresponding TCP sockets used for communication. We do not modify the Linux kernel network stack and the packets with ToS set to 0x28 reach to the NIC like regular TCP packets. Inside the NIC, a simple comparator checks the ToS field of each incoming packet; if the ToS field is set to 0x28, then the packet is sent to the compression engine 1522, otherwise we do not perform compression for the outgoing packet. On a receiver node NIC, we have the same comparator for incoming packets. If the ToS field is set to 0x28, then the NIC performs decompression on the packet. Otherwise, the received packet is a regular Ethernet packet and is directly sent to the processor for reception.

Table I enumerates the list of evaluated DNN models with the used hyper-parameters for training. In the below paragraphs, results of testing are disclosed. AlexNet is a convolutional neural network (CNN) model for image classification, which includes 5 convolutional layers and 3 fully connected layers with rectified linear unit (ReLU) as the activation function. Before the first and the second fully connected layers, the dropout layers are applied. The model size of AlexNet is 233 MB. For our experiments, we use 1,281,167 training and 50,000 test examples from the ImageNet dataset.

TABLE I

| Hyperparameters of different benchmarks. | | | | |
|---|---|---|---|---|
| Hyperparameter | AlexNet | HDC | ResNet-50 | VGG-16 |
| Per-node batch size | 64 | 25 | 16 | 64 |
| Learning rate (LR) | −0.01 | −0.1 | 0.1 | −0.01 |
| LR reduction | 10 | 5 | 10 | 10 |
| Number of LR reduction iterations | 100000 | 2000 | 200000 | 100000 |
| Momentum | 0.9 | 0.9 | 0.9 | 0.9 |
| Weight decay | 0.00005 | 0.00005 | 0.0001 | 0.00005 |
| Number of training iterations | 320000 | 10000 | 600000 | 370000 |

Handwritten Digit Classification (HDC) is a DNN model composed of five fully-connected layers, which performs handwritten digits recognition. The dimension of each hidden layer is 500 and the model size is 2.5 MB. The used dataset is from the Modified National Institute of Standards and Technology (MNIST) database, which contains 60,000 training and 10,000 test images of digits.

ResNet-50 is a state-of-the-art DNN model for the image classification task, which offers several variants that have different number of layers. Our experiments use the most sion/decompression accelerators. We employ an additional node as an aggregator to support the conventional worker-aggregator based approach, for purpose of comparison. We also extend our cluster up to eight nodes to evaluate the disclosed system scalability, while the rest of experiments are performed on the four-node cluster due to limited resources. The nodes are connected to a NETGEAR ProSafe 10 Gb Ethernet switch.

TABLE II

Detailed time breakdown of training different benchmarks using the worker-aggregator based five-node cluster. Measurements are based on 100-iteration training time in seconds.

| Steps | AlexNet | | HDC | | ResNet-SO | | VGG-16 | |
|---|---|---|---|---|---|---|---|---|
| | Abs. | Norm. | Abs. | Norm. | Abs. | Norm. | Abs. | Norm. |
| Forward pass | 3.13 | 1.6% | 0.08 | 4.9% | 2.63 | 3.5% | 32.25 | 4.3% |
| Backward pass | 16.22 | 8.3% | 0.07 | 4.3% | 4.87 | 6.5% | 142.34 | 17.3% |
| GPU copy | 5.68 | 2.9% | — | — | 2.24 | 3.0% | 12.09 | 1.5% |
| Gradient sum | 8.94 | 4.6% | 0.09 | 5.2% | 3.68 | 4.9% | 19.89 | 2.4% |
| Communicate | 148.71 | 75.7% | 1.36 | 80.2% | 60.58 | 80.2% | 583.58 | 70.9% |
| Update | 13.67 | 7.0% | 0.09 | 5.3% | 1.55 | 2.1% | 30.50 | 3.7% |
| Total training time | 196.35 | 100.0% | 1.7 | 100.0% | 75.55 | 100.0% | 823.65 | 100.0% | popular variant, ResNet-50, which contains 49 convolution layers and one fully connected layer at the end of the network. ResNet-50 has a model size of 98 MB and uses the ImageNet dataset.

VGG-16 is another CNN model for image classification, which includes 13 convolutional layers and three fully connected layers. VGG-16 also uses ImageNet dataset and its model size is 525 MB.

We develop a custom distributed training framework in C++ using NVIDIA CUDA 8.0, Intel Math Kernel Library (MKL) 2018, and OpenMPI 2.0. The disclosed network interface device 1502 and associated algorithms can be implemented in publicly-released DNN training frameworks such as TensorFlow. However, our custom distributed execution framework is more amenable for integration with software and hardware implementation of our lossy compression algorithm. In our custom training framework, the computation steps of DNN training such as forward and backward propagations are performed on the GPU (also CPU compatible), while communication is handled via OpenMPI APIs. Additionally, our framework implements diverse distributed training architectures and communication algorithms using various types of OpenMPI APIs to exchange gradients and weights.

For the hardware of the test system, we use a cluster of four nodes, each of which is equipped with a NVIDIA Titan XP GPU, an Intel Xeon CPU ES-2640 @2.6 GHZ, 32 GB DDR4-2400T, and a Xilinx VC709 board that implements a 10 Gb Ethernet reference design along with our compres- The state-of-the-art network architectures of datacenter at large Internet companies such as Google and Facebook use 1~10 Gbps network connections within a rack and 10~100 Gbps connections for the oversubscribed links between the top of rack switches. As the servers running the training applications are connected to the top of rack switches, we did not consider supporting 40~100 Gbps network connections for our experiments. Furthermore, we designed the compression/decompression engines within the accelerators such that they do not affect the operating frequency (e.g., 100 MHz) and bandwidth while successfully demonstrating the full functionality with the modified NIC driver and OpenMPI APIs.

Our distributed training framework runs concurrently on each node in our cluster and all performance evaluations are based on the real wall clock time. As we discover that the 10 Gb Ethernet reference design implemented in a Xilinx VC709 board can achieve only ~2.1 Gb due to inefficiency in its driver and design, we use Intel X540T1 10 Gb Ethernet NICs to measure the total training and communication times when we do not deploy hardware compression. That is, we use the Intel X540T1 NIC for the baseline measurements. To measure the communication time after deploying hardware compression, we first measure the breakdown of communication time (e.g., driver time, NIC hardware time, and TX/RX time through links) from both NICs based on Xilinx VC709 board and Intel X540T1 10 Gb Ethernet NICs. Then, we scale the TX/RX time through the link of the Intel NIC based on a compression ratio corresponding to a given iteration to calculate the total communication time while accounting for the compression/decompression time.

Figure 19:
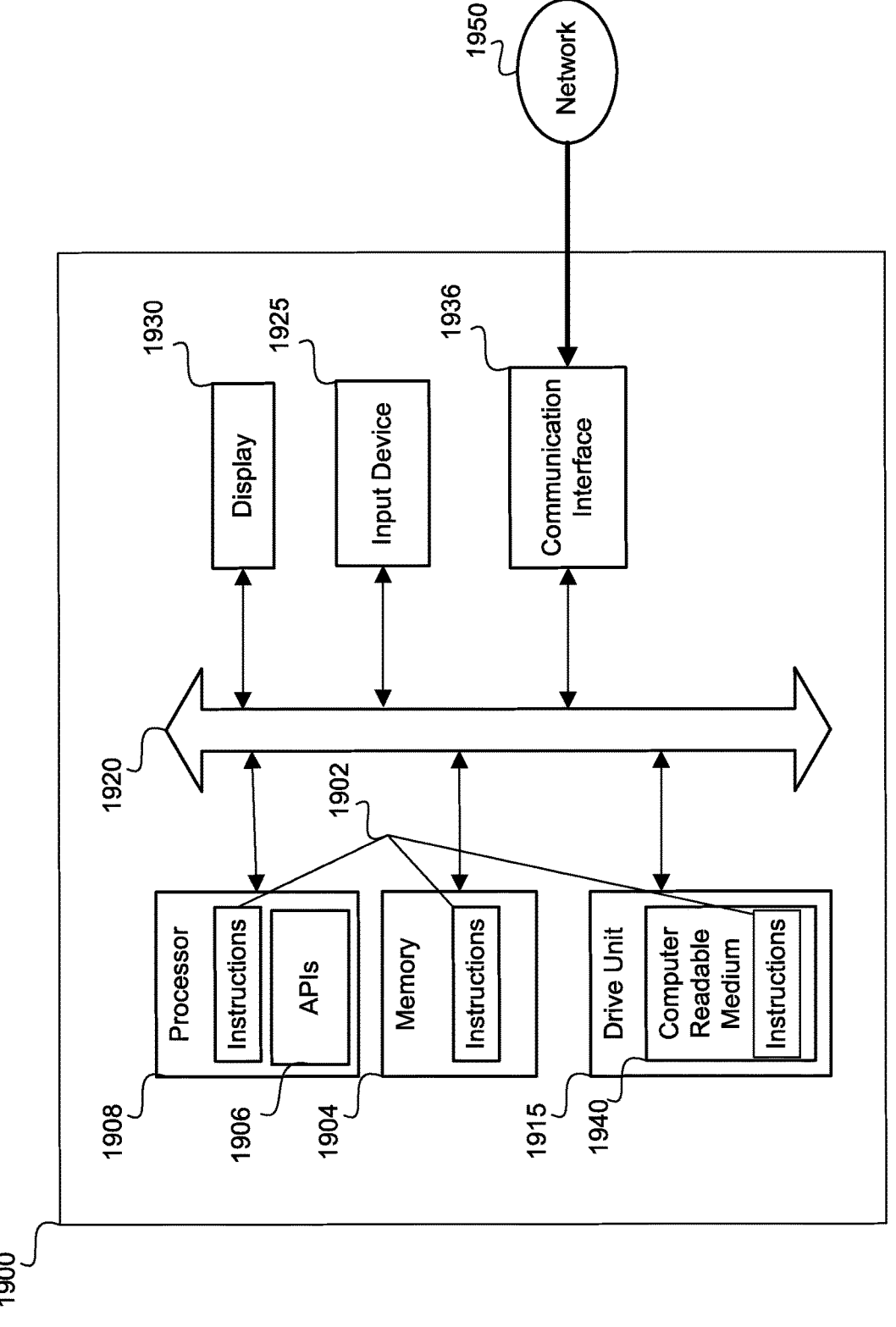
FIG. 19 is a block diagram of an example computer system in which embodiments of the present disclosure can operate.

FIG. 19 illustrates an example machine of a computer system 1900 within which a set of instructions, for causing the machine to perform any one or more of the methodologies discussed herein, can be executed. In some embodiments, the computer system 1900 can correspond to a host system (e.g., the host processor 1505 and/or network interface device 1502 of FIG. 15) that includes, is coupled to, or utilizes such a network interface device 1502. In other embodiments, the computer system 1900 can correspond to a computing device or node as those terms are used throughout. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1900 includes a processing device 1902, a main memory 1904 (e.g., read-only memory (ROM), flash memory, dynamic random access memory (DRAM) such as synchronous DRAM (SDRAM) or Rambus DRAM (RDRAM), etc.), a static memory 1906 (e.g., flash memory, static random access memory (SRAM), etc.), and a data storage system 1918, which communicate with each other via a bus 1930.

Processing device 1902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1902 can also be one or more special-purpose processing devices such as an application specific integrated circuit (ASIC), a field programmable gate array (FPGA), a digital signal processor (DSP), network processor, or the like. The processing device 1902 is configured to execute instructions 1926 for performing the operations and steps discussed herein. The computer system 1900 can further include a network interface device 1908 to communicate over the network 1920.

The data storage system 1918 can include a machine-readable storage medium 1924 (also known as a computer-readable medium) on which is stored one or more sets of instructions 1926 or software embodying any one or more of the methodologies or functions described herein. The instructions 1926 can also reside, completely or at least partially, within the main memory 1904 and/or within the processing device 1902 during execution thereof by the computer system 1900, the main memory 1904 and the processing device 1902 also constituting machine-readable storage media. The machine-readable storage medium 1924, data storage system 1918, and/or main memory 1904 can correspond to the memory in the host processor 1505 or the FIFO buffer 1526 in the network interface device.

In one embodiment, the instructions 1926 include instructions to implement functionality corresponding to any OS, driver, software, or network stacked described herein. While the machine-readable storage medium 1924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A distributed network comprising:

a first group of computing devices comprising computing devices circularly and sequentially coupled from a first computing device, to at least a second computing device, and to a final computing device coupled to the first computing device, wherein respective ones of the first group of computing devices are to sequentially aggregate gradient values from the first computing device to the final computing device, wherein the gradient values are data for training a neural network model and stored in each computing device of the first group of computing devices before aggregation begins, and wherein, to sequentially aggregate the gradient values, each computing device of the first group of computing devices, except the first computing device, is to:

combine locally stored gradient values with a partial aggregate of gradient values received from a previous device of the first group of computing devices; and store the combined gradient values locally;

wherein a first aggregate of the gradient values is buffered at the first computing device and the first computing device is to transfer the first aggregate of the gradient values to a second group of computing devices communicatively coupled to the first group of computing devices; and the second group of computing devices comprising computing devices circularly and sequentially coupled from a second first computing device to a second final computing device, wherein the second final computing device is also coupled to the second first computing device, and wherein the second group of computing devices is to generate, from the first aggregate of the gradient values, a second aggregate of gradient values to be used to train the neural network model.

2. The distributed network of claim 1, wherein the second computing device of the first group of computing devices is to receive new gradient values concurrently with transferring a first partial aggregate of gradient values to a third computing device of the first group of computing devices, and wherein the new gradient values are received from the first computing device.

3. The distributed network of claim 1, wherein, to sequentially aggregate the gradient values:

the first computing device is to transfer first gradient values to the second computing device, of the first group of computing devices, coupled to the first computing device;

the second computing device is to aggregate second gradient values with the first gradient values to generate a first partial aggregate of gradient values and transfer the first partial aggregate of gradient values to a third computing device, of the first group of computing devices, coupled to the second computing device;

the third computing device is to aggregate third gradient values with the first partial aggregate of gradient values to generate a second partial aggregate of gradient values and transfer the second partial aggregate of gradient values to at least one subsequent computing device, of the first group of computing devices, coupled to the third computing device;

the at least one subsequent computing device is to aggregate additional gradient values with the second partial aggregate of gradient values to generate a final partial aggregate of gradient values and transfer the final partial aggregate of gradient values to the final computing device, wherein the final computing device is coupled to the at least one subsequent computing device; and the final computing device is to aggregate final gradient values with the final partial aggregate of gradient values to generate the first aggregate of gradient values.

4. The distributed network of claim 1, wherein, to generate the second aggregate of gradient values:

the second first computing device is to transfer first gradient values to a second computing device, of the second group of computing devices, coupled to the second first computing device;

the second computing device is to aggregate second gradient values with the first gradient values to generate a first partial aggregate of gradient values and transfer the first partial aggregate of gradient values to a third computing device, of the second group of computing devices, coupled to the second computing device;

the third computing device is to aggregate third gradient values with the first partial aggregate of gradient values to generate a second partial aggregate of gradient values and transfer the second partial aggregate of gradient values to at least one subsequent computing device, of the second group of computing devices, coupled to the third computing device;

the at least one subsequent computing device is to aggregate additional gradient values with the second partial aggregate of gradient values to generate a final partial aggregate of gradient values and transfer the final partial aggregate of gradient values to the second final computing device, wherein the second final computing device is coupled to the at least one subsequent computing device; and the second final computing device is to aggregate final gradient values with the final partial aggregate of gradient values to generate the second aggregate of gradient values.

5. The distributed network of claim 1, further comprising a third group of computing devices circularly and sequentially coupled from a third first computing device to a third final computing device that is coupled to the third first computing device, wherein:

the second group of computing devices is to transfer the second aggregate of gradient values to the third group of computing device;

respective ones of the third group of computing devices are to sequentially aggregate gradient values, wherein the aggregate gradient values are stored in each computing device of the third group of computing devices, starting with the second aggregate of gradient values, from the third first computing device to the third final computing device to obtain a third aggregate of gradient values at the final computing device; and the third first computing device is to transfer the third aggregate of gradient values to a fourth group of computing devices communicatively coupled to the third group of computing devices, wherein the third aggregate of gradient values is to be used to train the neural network model.

6. The distributed network of claim 5, further comprising a fourth group of computing devices circularly and sequentially coupled from a fourth first computing device to a fourth final computing device coupled to the fourth first computing device, wherein:

the third group of computing devices is to transfer the third aggregate of gradient values to the fourth group of computing device;

respective ones of the fourth group of computing devices are to sequentially aggregate gradient values, wherein the aggregate gradient values are stored in each computing device of the fourth group of computing devices, starting with the third aggregate of gradient values, from the fourth first computing device to the fourth final computing device to obtain a fourth aggregate of gradient values at the final computing device; and the fourth first computing device is to transfer the fourth aggregate of gradient values to a fifth group of computing devices communicatively coupled to the fourth group of computing devices, wherein the fourth aggregate of gradient values is to be used to train the neural network model.

7. The distributed network of claim 1, wherein, to perform compression during training, each computing device of at least some of the first group of computing devices is to:

evenly partition a vector of gradient values into multiple numbered blocks of gradient values;

receive a first numbered block, of the multiple numbered blocks of gradient values, from a first neighbor computing device;

perform sum-reduction on an own first numbered block and the first numbered block of the first neighbor computing device, to generate an updated first numbered block; and transfer the updated first numbered block to a second neighbor computing device for further sum-reduction in a cascaded manner using, at each iteration of sum-reduction, a received updated numbered block and an own updated numbered block, to obtain a different subset of the first aggregate of gradient values.

8. The distributed network of claim 7, wherein each computing device of the at least some of the first group of computing devices is further to:

propagate a first subset of the first aggregate of gradient values to a different-numbered computing device of the first group of computing devices; and simultaneously receive a second subset of the first aggregate of gradient values from a different-numbered computing device of the first group of computing devices.

9. A method of operating a distributed network of a first group of computing devices comprising computing devices circularly and sequentially coupled from a first computing device, to at least a second computing device, and to a final computing device coupled to the first computing device, and a second group of computing devices comprising computing devices circularly and sequentially coupled from a second first computing device to a second final computing device, wherein the second final computing device is also coupled to the second first computing device, the method comprising:

sequentially aggregating, by respective ones of the first group of computing devices, gradient values from the first computing device to the final computing device, wherein the gradient values are data for training a neural network model and stored in each computing device of the first group of computing devices before the aggregating begins, and wherein the sequentially aggregating the gradient values comprises each computing device of the first group of computing devices, except the first computing device:

combining locally stored gradient values with a partial aggregate of gradient values received from a previous device of the first group of computing devices; and storing the combined gradient values locally;

wherein storing the aggregate gradient values in each computing device of the first group of computing devices results in a first aggregate of gradient values being buffered at the first computing device;

transferring, by the first computing device, the first aggregate of gradient values to the second group of computing devices; and generating, by the second group of computing devices, from the first aggregate of gradient values, a second aggregate of gradient values to be used to train the neural network model.

10. The method of claim 9, further comprising receiving, by the second computing device of the first group of computing devices, new gradient values concurrently with transferring a first partial aggregate of gradient values to a third computing device of the first group of computing devices, wherein the new gradient values are received from the first computing device.

11. The method of claim 9, wherein, to sequentially aggregate the gradient values, the method further comprising:

transferring, by the first computing device, first gradient values to the second computing device, of the first group of computing devices, coupled to the first computing device;

aggregating, by the second computing device, second gradient values with the first gradient values to generate a first partial aggregate of gradient values;

transferring, by the second computing device, the first partial aggregate of gradient values to at least one subsequent computing device, of the first group of computing devices, coupled to the second computing device;

aggregating, by the at least one subsequent computing device, additional gradient values with the first partial aggregate of gradient values to generate a final partial aggregate of gradient values;

transferring, by the at least one subsequent computing device, the final partial aggregate of gradient values to the final computing device, wherein the final computing device is coupled to the at least one subsequent computing device; and aggregating, by the final computing device, final gradient values with the final partial aggregate of gradient values to generate the first aggregate of gradient values.

12. The method of claim 9, wherein generating the second aggregate of gradient values comprises:

transferring, by the second first computing device, first gradient values to a second computing device, of the second group of computing devices, coupled to the second first computing device;

aggregating, by the second computing device, second gradient values with the first gradient values to generate a first partial aggregate of gradient values;

transferring, by the second computing device, the first partial aggregate of gradient values to at least one subsequent computing device, of the second group of computing devices, coupled to the second computing device;

aggregating, by the at least one subsequent computing device, additional gradient values with the first partial aggregate of gradient values to generate a final partial aggregate of gradient values;

transferring, by the at least one subsequent computing device, the final partial aggregate of gradient values to the second final computing device, wherein the second final computing device is coupled to the at least one subsequent computing device; and aggregating, by the second final computing device, final gradient values with the final partial aggregate of gradient values to generate the second aggregate of gradient values.

13. The method claim 12, wherein the distributed network further comprises a third group of computing devices circularly and sequentially coupled from a third first computing device to a third final computing device coupled to the third first computing device, and a fourth group of computing devices communicatively coupled to the third group of computing devices, the method further comprising:

transferring, by the second group of computing devices, the second aggregate of gradient values to the third group of computing device;

sequentially aggregating, by respective ones of the third group of computing devices, aggregate gradient values, wherein the aggregate gradient values are stored in each computing device of the third group of computing devices, starting with the second aggregate of gradient values, from the third first computing device to the third final computing device to obtain a third aggregate of gradient values at the final computing device; and transferring, by the third final computing device, the third aggregate of gradient values to the fourth group of computing devices, wherein the third aggregate of gradient values is to be used to train the neural network model.

14. The method claim 13, wherein the distributed network further comprises a fourth group of computing devices circularly and sequentially coupled from a fourth first computing device to a fourth final computing device coupled to the fourth first computing device, and a fifth group of computing devices communicatively coupled to the fourth group of computing devices, the method further comprising:

transferring, by the third group of computing devices, the third aggregate of gradient values to the fourth group of computing device;

sequentially aggregating, by respective ones of the fourth group of computing devices, gradient values, wherein the gradient values are stored in each computing device of the fourth group of computing devices, starting with the third aggregate of gradient values, from the fourth first computing device to the fourth final computing device to obtain a fourth aggregate of gradient values at the final computing device; and transferring, by the fourth first computing device, the fourth aggregate of gradient values to the fifth group of computing devices, wherein the fourth aggregate of gradient values is to be used to train the neural network model.

15. The method of claim 9, further comprising performing compression during training, wherein the performing comprises, by each computing device of at least some of the first group of computing devices:

evenly partitioning a vector of gradient values into multiple numbered blocks of gradient values;

receiving a first numbered block, of the multiple numbered blocks of gradient values, from a first neighbor computing device;

performing sum-reduction on an own first numbered block and the first numbered block of the first neighbor computing device, to generate an updated first numbered block; and transferring the updated first numbered block to a second neighbor computing device for further sum-reduction in a cascaded manner using, at each iteration of sum-reduction, a received updated numbered block and an own updated numbered block, to obtain a different subset of the first aggregate of gradient values.

16. The method of claim 15, further comprising, by each computing device of the at least some of the first group of computing devices:

propagating a first subset of the first aggregate of gradient values to a different-numbered computing device of the first group of computing devices; and simultaneously receiving a second subset of the first aggregate of gradient values from a different-numbered computing device of the first group of computing devices.

* * * * *